(12) United States Patent
Li et al.

(10) Patent No.: US 6,331,675 B1
(45) Date of Patent: *Dec. 18, 2001

(54) HIGH TEXTURE FACTOR

(75) Inventors: Qi Li, Waltham; Eric R. Podtburg, Natick; Patrick John Walsh, Newton; William L. Carter, Chelmsford; Gilbert N. Riley, Jr., Marlborough; Martin W. Rupich, Framingham, all of MA (US); Elliott Thompson, Coventry, RI (US); Alexander Otto, Chelmsford, MA (US)

(73) Assignee: American Superconductor Corporation, Westborough, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/843,041

(22) Filed: Apr. 11, 1997

Related U.S. Application Data

(62) Division of application No. 08/468,089, filed on Jun. 6, 1995.

(51) Int. Cl.[7] .................................................. H01B 12/10
(52) U.S. Cl. ........................... 174/125.1; 29/599; 427/62; 505/431; 505/887
(58) Field of Search ........................... 174/125.1; 29/599; 427/62; 505/431, 704, 887, 430

(56) References Cited

U.S. PATENT DOCUMENTS

| | | | |
|---|---|---|---|
| 4,988,669 | * | 1/1991 | Dersch ................................ 174/125.1 |
| 5,093,314 | * | 3/1992 | Takahashi et al. ................... 505/230 |
| 5,132,278 | * | 7/1992 | Stevens et al. ................... 505/704 X |
| 5,187,149 | * | 2/1993 | Jin et al. .............................. 505/450 |
| 5,204,316 | * | 4/1993 | Arendt et al. ......................... 505/432 |
| 5,208,215 | * | 5/1993 | Chen et al. ........................... 505/433 |
| 5,246,917 | * | 9/1993 | Hikata et al. ........................ 505/433 |
| 5,284,823 | * | 2/1994 | Chou et al. .......................... 505/491 |
| 5,330,969 | * | 7/1994 | Finnemore et al. ................. 505/431 |

FOREIGN PATENT DOCUMENTS

| | | |
|---|---|---|
| 0 281 474 A2 | 9/1988 | (EP) . |
| 0 435 286 A1 | 7/1991 | (EP) . |
| 0 504 909 A2 | 9/1992 | (EP) . |
| 0 475 315 B1 | 12/1995 | (EP) . |
| 0 710 993 A1 | 5/1996 | (EP) . |
| 4-277410 | * 10/1992 | (JP) .................................. 174/125.1 |
| 230 404 | 5/1991 | (NZ) . |

OTHER PUBLICATIONS

Yoshida et al., "High–Resolution Lattice Image of ErBa Cu O and Bl Sr CaCU O Observed at 4.2K", 1989.*

(List continued on next page.)

Primary Examiner—Albert W. Paladini
(74) Attorney, Agent, or Firm—Hale and Dorr LLP

(57) ABSTRACT

An aspected multifilamentary oxide article is provided having a plurality of aspected filaments including a metal oxide and extending continuously for the length of the article. A constraining member substantially surrounds each filament, wherein each of the filaments has an average transverse cross-sectional thickness less than about 35 μm and an average variation in cross-section along its length of less than about 10%. The article exhibits superior filament uniformity, hardness, and oxide density and texture.

11 Claims, 9 Drawing Sheets

OTHER PUBLICATIONS

Asaro, R.J. et al., "Mechanical Processing of High $J_c$ BSCCO Superconductors," *Philosophical Magazine* 66(4):517–538 (1992), Preprint available (Dec., 1991).

Korzekwa, D.A. et al., "Deformation Processing of Wires and Tapes Using the Oxide–Powder–in–Tube Method," *Applied Superconductivity* 2(3/4):261–270 (1994).

Li, Q. et al., "Critical Current Density Enhancement in Ag–Sheathed Bi–2223 Superconducting Tapes," *Physica C* 217:360–366 (1993).

Lotgering, "Topotactical Reactions with Ferrimagnetic Oxides Having Hexagonal Crystal Structures—I," *J. Inorg. Nucl. Chem.* 9:113–123 (1959).

Motowidlo, L.R. et al., "Mechanical and Electrical Properties of BSCCO Multifilament Tape Conductors," Presented at Materials Research Society Meeting, San Francisco, CA, Apr. 12–15, 1993.

Sandhage, K.H. et al., "Critical Issues in the OPIT Processing of High–$J_c$ BSCCO Superconductors," *JOM* 1991:21–25 (1991).

\* cited by examiner

PRIOR ART

HIGH TEXTURE FACTOR

This Application is a division of Application of Ser. No. 08/468,089 filed on Jun. 6, 1995.

This invention relates to a process for converting oxide superconducting precursors into textured and densified oxide superconductor articles. This invention further relates to a method for preparing an oxide superconducting composite in a minimum of processing steps.

BACKGROUND OF THE INVENTION

Superconductors are materials having essentially zero resistance to the flow of electrical current at temperatures below a critical temperature, $T_c$. A variety of copper oxide materials have been observed to exhibit superconductivity at relatively high temperatures, i.e., above 77K. Since the discovery of the copper oxide-based superconductors, their physical and chemical properties have been widely studied and described in many publications, too numerous to be listed individually.

Composites of superconducting materials and metals are often used to obtain better mechanical and electrical properties than superconducting materials alone provide. These composites may be prepared in elongated forms such as wires and tapes by a well-known process which includes the stages of: (a) forming a powder of superconductor precursor material (precursor powder formation stage); (b) filling a metal container, such as a tube, billet or grooved sheet, with the precursor powder and deformation processing one or more filled containers to provide a composite of reduced cross-section including one or more cores (filaments) of superconductor precursor material in a surrounding metal matrix (composite precursor fabrication stage); and (c) further thermally processing the composite to form and sinter a core material having the desired superconducting properties (thermomechanical processing).

In order to be useful for the majority of applications, substantially single phase superconducting materials with high critical current densities ($J_c$) are needed. The current-carrying capacity of a superconducting oxide depends significantly upon the degree of alignment and connection of the superconducting oxide grains, together known as "texturing". The processing of such high-performance superconducting materials may be constrained by the necessity of texturing and densifying the material in order to achieve adequate critical current density. The need to add additional processing steps into the manufacture of an oxide superconductor article in order to achieve adequate critical current density adds significantly to the cost of the final article.

Known processing methods for texturing superconducting oxide composites include various forms of heat treatments and deformation processing (thermomechanical processing). Certain superconducting oxide grains can be oriented along the direction of an applied strain, a phenomenon known as deformation-induced texturing (DIT). Deformation techniques, such as pressing and rolling, have been used to induce grain alignment of the oxide superconductor c-axis perpendicular to the plane or direction of elongation. Heat treatment under conditions which at least partially melt and regrow desired superconducting phases also may promote texturing by enhancing the anisotropic growth of the superconducting grains, a phenomenon known as reaction-induced texturing (RIT).

Typically, density and degree of texture are developed in the article by repeated steps of deformation (to impart deformation-induced texturing) and sintering (to impart reaction-induced texturing). The steps of deforming and sintering may be carried out several times, resulting in a process that is both time consuming and expensive. The process may be designated by the term "nDS", in which "D" refers to the deformation step, "S" refers to the sintering or heating step and "n" refers to the number of times the repetitive process of deformation and sintering are carried out. Typical prior art processes are 2DS or 3DS processes.

It is desirable, therefore, to provide a method for preparing a superconducting article having critical current densities acceptable to the art in fewer steps. It is desirable to minimize the number of process steps required while obtaining an acceptable degree of texture and oxide density. In particular, it is desirable to prepare such a superconducting article using a simplified deformation-sintering process which reduces the amount of processing steps required to obtain a superconducting oxide article having adequate critical current. In determining adequate critical current, price to performance ratio ($/KA·m) should be minimized.

The prior art has investigated many texturing processes, but have been unable to reduce the deformation-sintering process to a single iteration, that is a 1DS process while retaining acceptable electrical properties. Chen et al. in U.S. Pat. No. 5,208,215 reports a method of gradually reducing the thickness of a superconducting oxide tape through at least two pressing steps, each pressing step followed by a heating step at 843° C., thus reporting at least a 2DS process. Sumitomo Electric Industries, in New Zealand Application No. 230404, reports on 2DS processes for improving high critical current density, in which a variety of processing conditions such as sintering temperatures and times, cooling rates, percent deformation and deformation loads were investigated.

Hikata et al. in U.S. Pat. No. 5,246,917 reports the use of a 2DS or 3DS process for improving critical current density of an oxide superconducting wire which utilizes second rollers for the second rolling process which are at least 5 cm larger than those used in the first rolling step. Sumitomo Electric Industries in EP 0 504 908 A1 reports a 2DS process in which the rolling operation is carried out with rollers having an increased frictional force.

Likewise, Sumitomo Electric Industries, in EP 0 435 286 A1 ("EP '286"), reports a two-step rolling operation for a monofilament wire. Large reduction rolling drafts are used to form a flattened tape, however, EP '286 discloses that a subsequent rolling operation at smaller drafts is performed before the final heat treatment, thereby teaching a 2DS process. Further, the thicknesses of monofilament wires make it difficult to obtain crack-free high performance wires in a single rolling operation.

Some 1DS processes have been reported; however, they do not result in oxide superconducting wire having acceptable critical current densities. Takahashi et al. in U.S. Pat. No. 5,093,314 disclose a perovskite oxide superconductor monofilament wire prepared by subjecting the wire to repeated extrusions, followed by rolling and heat treatment (a 1DS process) However, Takahashi et al. report performing deformation operations on fully formed oxide superconductor powders which are known to respond poorly to RIT and DIT processes. The fully formed oxide superconductor is not well suited to RIT because the product oxide has already been formed. For example, critical current densities reported by Takahashi et al. are no greater than 3800 A/cm² for a BSCCO sample.

In a similar fashion, Sumitomo Electric Industries, in EP 0 281 477 A2, 2 describes a process for manufacture of an oxide superconductor in which the oxide superconductor powder is first formed and then introduced into a metallic tube and plastically deformed under compressive strain. Such a method suffers from limitations similar to those mentioned above for Takahashi et al.

Common deformation techniques in nDS processes include extrusion, drawing, rolling or pressing. Common measures of the effectiveness of the deformation process are expressed as degree of texture, core hardness and core density. Increased core hardness has been associated with improved texturing and core density. Core hardness is a measurement of the hardness of the material as determined by a standard test, such as an indent test. Core density is the density of the oxide powder. Degree of texturing is represented by a fraction between one and zero, with one representing 100% alignment of the c-axes of the oxide grains, such that their slip planes are parallel.

Uniaxial pressing may be an effective method of both aligning the anisotropic oxide grains and densifying the oxide core. See, Li et al. *Physica C* 217, 360–366 (1993) and Korzekawa et al. *Appl. Superconduct.* 2(3/4), 261–270 (1994), incorporated by reference herein. The pressing technique has at least one serious drawback in that it can not be carried out conveniently, uniformly and continuously over long lengths of superconducting material.

Rolling, on the other hand, is well-suited for continuous processing of long lengths of superconducting material, particularly wire or tape. However, the rolling operation may sometimes induce cracks and shear bands of the oxide filaments in a direction disruptive to current flow. Further, certain rolling conditions lead to the undesirable distortion of the oxide/metal interface, known as "sausaging". See, Li et al. This type of deformation is illustrated in FIG. 1, in which dark regions 10 represent oxide filaments and lighter regions 12 represent a surrounding metal matrix. Under certain rolling conditions, an interface 14 of the composite is distorted into a rolling, wavy conformation, resulting in alternating narrow regions 18 and wide regions 16 in the oxide filaments 10.

Cracking, formation of shear bands and sausaging may be reduced in a rolling process by the use of extremely low reduction drafts. Typically, multiple reductions on the order of 3% to 5% per pass are used. See, Korzekwa et al., Id. While such low reduction passes may reduce sausaging, it has not been shown to eliminate it entirely. Additionally, low reduction passes exert only a small working force on the composite so that core density, texture and hardness remain very low. For example, the degree of texturing is only around 0.6. Also important, low reduction drafts require multiple processing steps to obtain suitably thin dimensions, thereby increasing the chances of material mishandling and driving up processing costs.

EP 0 435 286 by Sumitomo Electric Industries (EP '286) describes the preparation of monofilament superconducting oxide wire by flat working the wire at a draft of 80% to 98% reduction in thickness with rollers of 150 mm (7") diameter, followed by subsequent heat treatment and low reduction rolling. EP '286 reports an increase in critical current density and suggests that it may be due to improvements in density and orientation, but no mention is made of cracks or rolling defects, such as sausaging. Investigation by applicants has established that roll working of monofilaments is less sensitive to sausaging. Therefore, EP '286 does not address the sausaging problem in multifilamentary systems.

It has been observed that preferred alignment of superconducting oxide grains can be obtained by the growth of oxide grains in long, thin filaments constrained within a metal matrix. The application of constrained growth of oxide grains is set forth in greater detail in U.S. Ser. No. 08/059,871 filed May 19, 1993, which is a file wrapper continuation of U.S. Ser. No. 07/686,792, now abandoned, entitled "A Method of Producing Textured Superconducting Oxide Bodies by the Oxidation/Annealing of Thin Metallic Precursors", which are incorporated by reference in its entirety herein. The application describes superconducting oxide compositions having improved crystallographic alignment by constraining the oxide filament diameter to a dimension on the order of the longest dimension of the oxide superconductor grain. It is therefore desirable to prepare superconducting articles having such constrained dimensions so as to take advantage of constrained grain growth.

As discussed extensively above, however, deformation rolling introduces structural defects or sausaging which destroy the constrained volume, at least locally (see, FIG. 1). When rolling operations are carried out on compositions containing such long, thin filaments, "sausaging" occurs which results in localized filament diameters which are considerably greater than desired. In those regions, texturing and core density is reduced, as described above. FIG. 2 schematically illustrates the effect that the narrowing and expansion of the filament thickness along the filament length has on the alignment of grains of a constrained multifilamentary oxide superconducting article 40. Article 40 includes regions 42 having a dimension sufficient to constrain grain growth to substantially parallel to the constraining dimension, so as to provide dense, aligned oxide grains 44. Article 40 also contains regions 46 which are of significantly greater dimension. Region 46 is typically introduced into the article 40 in rolling deformation processes. The dimension of region 46 is too large to constrain grain growth to a particular orientation. As a result, oxide grains 48 are randomly oriented. Porosity of region 46 increases significantly because of the reduced packing efficiency of the randomly oriented grains.

Therefore, there remains a need to develop deformation processes that avoid cracking, shear band formation and sausaging, while imparting the desired degree of texturing, core density and hardness to a multifilamentary superconducting oxide article. Multifilamentary articles are more useful than monofilamentary articles for mechanical properties and AC applications. This invention enables high-performance multifilamentary oxide superconductor articles having superior performance as compared to prior art mono- and multifilamentary systems.

It is an object of the present invention to reduce the number of iterative deformation-sintering steps in the processing of an oxide superconductor article.

It is an object of the present invention to provide a method for forming a superconducting article having fine and uniform superconducting oxide filaments without cracks, band shear or sausaging.

It is a further object of the present invention to provide a method for preparing a superconducting oxide article having uniformly high degree of texturing and density using a high reduction deformation process.

It is a further method of the present invention to provide a method for deforming a multifilament superconducting article which optimizes the degree of texturing and core density in a minimum of processing steps.

It is an object of the present invention to provide a method for preparing a superconducting article having high critical current densities using fewer processing steps, namely a high reduction deformation step immediately preceding a single sintering process.

SUMMARY OF THE INVENTION

In one aspect of the present invention, a method for preparing a multifilamentary superconducting oxide article is provided. A precursor article is provided which includes a plurality of filaments including a precursor oxide in stoichiometric proportions to form an oxide superconductor, the filaments extending along the length of the article, and a constraining member substantially surrounding the filaments. The precursor article is roll worked in a high reduction draft in the range of about 40% to 95% in thickness to reduce the thickness of the constrained filament to a dimension of less than or substantially equivalent to a longest dimension of the oxide superconductor grains, and the rolled article is sintered to obtain the oxide superconductor.

In another aspect of the invention, a precursor article is provided which includes a plurality of filaments, the filaments including an precursor oxide in stoichiometric proportions to form an oxide superconductor. The filaments extend along the length of the article, and a constraining member substantially surrounds the filaments. The precursor article is roll worked in a high reduction draft in the range of about 40% to 95% in thickness, no further reduction in excess of about 5% occurring after the high reduction roll working step and prior to a sintering step, and the rolled article is sintered to obtain the oxide superconductor.

In yet another aspect of the present invention, a precursor article is provided which includes a plurality of filaments, the filaments including a precursor oxide in stoichiometric proportions to form an oxide superconductor. The filaments extend along the length of the article, and a constraining member substantially surrounds the filaments. The precursor article is roll worked in a high reduction draft in the range of about 40% to 95% in thickness, and the rolled article is sintered to obtain the oxide superconductor.

In one aspect of the invention the constrained filament has a dimension substantially equivalent to a longest dimension of the oxide superconductor grains after roll working. The constraining dimension is less than 100 $\mu$m and preferably less than 10 $\mu$m. The constraining dimension may include filament thickness or filament width. In another aspect of the invention, no further reduction of the article in excess of about 5% occurs after the high reduction roll working step and prior to a sintering step.

By "draft" as that term is used herein, it is meant the reduction in thickness of an elongated superconducting article in a single deformation operation.

By "roll working", as that term is used herein, it is meant the process of passing a round wire or rectangular tape through the constrained gap of one or more, i.e., a pair of, rollers, so that deformation results.

By "no further reduction of the article in excess of about 5% occurs after the high reduction roll working step", it is meant that no other deformation processing occurs after the high reduction rolling and before the sintering step. However, other processing operations may be contemplated at this stage of the 1DS process including an ODS (oxide dispersion strengthening) treatment, cabling, coiling winding or other mechanical processing, or conversion of a portion of the precursor oxide into the high temperature superconducting oxide of choice. A "portion" will generally include less than 25% of oxide volume.

In preferred embodiments, the high reduction draft is in the range of 40% to 95% in thickness and preferably in the range of 75% to 90% in thickness and preferably in the range of 60% to 90%. In another preferred embodiment, roll working includes rolling the article in a plurality of drafts to reduce thickness and subjecting the article to a final draft before heat treatment, the final draft including a high reduction draft in the range of about 40% to 95% in thickness. The plurality of drafts prior to final draft may include drafts in the range of 1% to 10% or additional high reduction drafts.

In other preferred embodiments, the constraining member includes a noble metal. Noble metal, as that term is used herein, is meant to include any metal or an alloy including a noble metal which is unreactive to the oxide superconductor or its precursors, under the reaction described herein, in particular the noble metal is substantially inert to oxidation under conditions of high temperature superconductor formation. Typical noble metals include, silver, gold, platinum and palladium, and alloys thereof.

In another aspect of the invention, the manufacture of a BSCCO 2223 superconducting oxide article includes subjecting an oxide article comprised of predominantly a BSCCO 2212 phase to a heat treatment at an oxygen partial pressure and temperature capable of modifying the phase composition of the oxide article. The heat treatment occurring prior to deformation and sintering of the oxide article. "Predominantly" is used herein to mean at least 50% and preferably greater than 90% of the named phase.

In another aspect of the invention, the manufacture of a BSCCO 2223 superconducting oxide article includes subjecting an oxide article comprised of a mainly a BSCCO 2212 phase to a heat treatment at an oxygen partial pressure in the range of about $10^{-5}$ to $10^{-2}$ atm $O_2$ and at a temperature in the range of about 600° C. to 850° C. The heat treatment occurring prior to deformation and sintering of the article.

In yet another aspect of the invention, the manufacture of a BSCCO 2223 superconducting oxide article includes subjecting a precursor to an oxide superconducting article to a heat treatment at an oxygen partial pressure in the range of about $10^{-5}$ to $10^{-2}$ atm $O_2$ and at a temperature in the range of about 600° C. to 850° C., said heat treatment occurring prior to deformation and sintering of the article.

In preferred embodiments, the oxygen partial pressure and temperature are selected such that the phase modification comprises conversion of a tetragonal phase BSCCO 2212 into an orthorhombic phase BSCCO 2212. The oxygen partial pressure may be in the range of about $10^{-5}$ to $10^{-2}$ atm $O_2$ and the temperature is in the range of about 600° C. to 850° C., and preferably in the range of about 700° C. to 800° C. and preferably in the range of about 750–790° C.

In other preferred embodiments, prior to heat treatment of the oxide article, a multifilamentary oxide article is provided which includes a plurality of oxide filaments comprised of mainly a BSCCO 2212 phase, each of the filaments extending along the length of the article, and a constraining member substantially surrounding each of the filaments, wherein a constraining dimension is substantially equivalent to a longest dimension of the oxide superconductor grains. The oxide article prior to phase modification may comprise a dominant amount of a tetragonal BSCCO 2212 oxide.

In other preferred embodiments, the method further includes roll working the heat treated oxide article, and preferably includes roll working the phase modified oxide article in a high reduction draft in the range of about 40% to 95% in thickness, and preferably includes rolling the heat treated oxide article in a plurality of drafts, and subjecting the rolled phase modified oxide article to a high reduction draft in the range of about 40% to 95% in thickness.

In another aspect of the invention, an oxide superconductor article is prepared in a 1DS process which includes a precursor article having a plurality of filaments containing a precursor oxide in stoichiometric proportions to form an oxide superconductor, the filaments extending along the length of the article, and a constraining non-superconductive boundary member substantially surrounding the filaments, wherein a constraining dimension is substantially equivalent to a longest dimension of the oxide superconductor grains. The precursor oxide article is subjected to a heat treatment at an oxygen partial pressure and temperature capable of modifying the phase composition of the oxide precursor and roll worked in a high reduction draft in the range of about 40% to 95% in thickness, the high reduction draft occurring just prior to sintering. The rolled article is sintered to obtain the oxide superconductor. In preferred embodiment, the precursor oxide is comprised of mainly a tetragonal BSCCO 2212 oxide.

By "single sintering process" it is meant, processing at a temperature or a series of temperatures, without further deformation texturing and sintering processing.

By "sintering" or "sintering heat treatment" as that term is used herein, it is meant a heat treatment by which oxides are converted into the high temperature oxide superconductor of choice and by which oxide grains are bonded together.

In another aspect of the invention, a BSCCO 2223 oxide superconductor article is prepared in a 1DS process by a filling a plurality of metal tubes with a predominant amount of orthorhombic BSCCO 2212 oxide; and reducing the diameter of each orthorhombic BSCCO 2212-filled metal tube and redrawing bundles of each of the orthorhombic BSCCO 2212-filled metal tube, so as to form a multifilamentary orthorhombic BSCCO 2212 oxide article constrained by the metal, wherein the plurality of filaments extend along the length of the article and wherein the constraining metal substantially surrounds each of the filaments, such that a constraining dimension is substantially equivalent to a longest dimension of the oxide superconductor grains. The orthorhombic BSCCO 2212 oxide article is roll worked in a high reduction draft in a range of about 40% to 95% in thickness, the high reduction draft occurring just prior to sintering. Thereafter, the rolled article is sintered to obtain the BSCCO 2223 oxide superconductor.

In another aspect of the present invention, a BSCCO 2223 oxide superconductor article is prepared by a 1DS process which includes providing a precursor article including a plurality of filaments including a precursor oxide comprised of mainly a tetragonal BSCCO 2212 phase, each of the filaments extending along the length of the article, and a constraining member substantially surrounding each of the filaments. The precursor oxide article is subjected to a heat treatment at an oxygen partial pressure and temperature selected to convert a tetragonal BSCCO 2212 phase into an orthorhombic BSCCO 2212 phase. The orthorhombic BSCCO 2212 oxide-containing article is roll worked in a high reduction draft in a range of about 40% to 95% in thickness, and the rolled article is sintered to obtain a BSCCO 2223 oxide superconductor.

In a preferred embodiment, the step of roll working is carried out to reduce the thickness of the constrained filament to a dimension of less than or substantially equivalent to a longest dimension of the oxide superconductor grains. The step of roll working alternatively is carried out such that no further reduction in excess of about 5% occurs after high reduction roll working and prior to sintering. In another preferred embodiment, the precursor oxide is comprised of a predominant amount of tetragonal phase BSCCO 2212. In other preferred embodiments, the high reduction draft is in the range of 75% to 90% in thickness, and preferably roll working includes rolling the article in a plurality of drafts, and subjecting the article to a high reduction draft in the range of about 40% to 95% in thickness.

In another aspect of the invention, an oxide superconductor article is prepared in a 1DS process by providing a precursor article which includes a plurality of filaments comprised of a precursor oxide in stoichiometric proportions to form an oxide superconductor, the filaments extending along the length of the article, and a constraining member substantially surrounding the filaments. The precursor oxide article is subjected to a heat treatment at an oxygen partial pressure in the range of about $10^{-5}$ to $10^{-2}$ atm $O_2$ and at a temperature in the range of about 600° C. to 850° C. The heated precursor article is roll worked in a high reduction draft in the range of about 40% to 95% in thickness, and then sintered to obtain the oxide superconductor.

In preferred embodiments, sintering includes heating at a first temperature in the range of 810° C. to 850° C., heating at a second temperature in the range of 800° C. to 840° C., and heating at a third temperature in the range of 700° C. to 800° C. Sintering includes heating at an oxygen partial pressure of about 0.0001 to 0.5 atm.

In yet another aspect of the present invention, a multifilamentary oxide superconductor article is provided which includes a plurality of filaments containing an oxide superconductor. The filaments extending along the length of the article. The article also includes a constraining member substantially surrounding each of the filaments. Each of the filament has an average transverse cross-section less than about 35 $\mu$m and an average variation in cross section along its length of less than about 15%. In preferred embodiments, each of the filaments has an average transverse cross-section less than about 20 $\mu$m and an average variation in cross section along its length of less than about 10%. The oxide superconductor is comprised of BSCCO 2223 in a preferred embodiment, but may also be comprised of any of the known superconductor oxide families.

In another aspect of the invention, a multifilamentary oxide article is provided which includes a plurality of filaments containing an oxide with the filaments extending along the length of the article. The article also includes a constraining member substantially surrounding each of the filaments. Each of the filaments has an average transverse cross-section less than about 35 $\mu$m and an average variation in cross section along its length of less than about 10%. In other preferred embodiments, each of the filaments has an average transverse cross-section less than about 20 $\mu$m and an average variation in cross section along its length of less than about 5%. The oxide is comprised of a BSCCO 2212 phase in a preferred embodiment, but may also be comprised of any oxide.

In other preferred embodiments, the article includes about 10 to 10,000 filaments per article, and preferably 10 to 1000 filaments per-article. The oxide filaments of the article may have a hardness of greater than 200 KHN. In other preferred embodiments, the article has a constraining dimension of less than 10 $\mu$m.

The multifilamentary article includes a plurality of filaments comprised of perdominantly BSCCO 2212 phase, each of the filaments extending along the length of the article, and a constraining member substantially surrounding each of the filaments, wherein a constraining dimension is substantially equivalent to a longest dimension of the oxide superconductor grains. In other preferred embodiments, article is a multifilamentary tape having filaments in the range of 10 to 10,000 filaments per article, and preferably 10 to 1000 filaments pre article.

In yet another aspect of the invention, a multifilamentary oxide article is provided including a plurality of filaments including an oxide, the filaments extending along the length of the article, and a constraining member substantially surrounding each said filament, said constraining member having a constraining dimension of less than or equal to about 10 microns. Each of said filament is comprised of oxide grains of less than about 5 microns in at least one dimension.

The method of the present invention provides an oxide article having superior electrical properties as compared to those conventionally prepared articles. Additionally, the method of the present invention represents a great improvement in the number and cost of processing steps necessary to obtain a high quality oxide superconductor. The article of the present invention may be used in a variety of applications, including, but not limited to the transmission of electricity and operation of electric motors.

BRIEF DESCRIPTION OF THE DRAWING

The invention is described with reference to the Drawing in which.

DETAILED DESCRIPTION OF THE INVENTION

Figure 1:
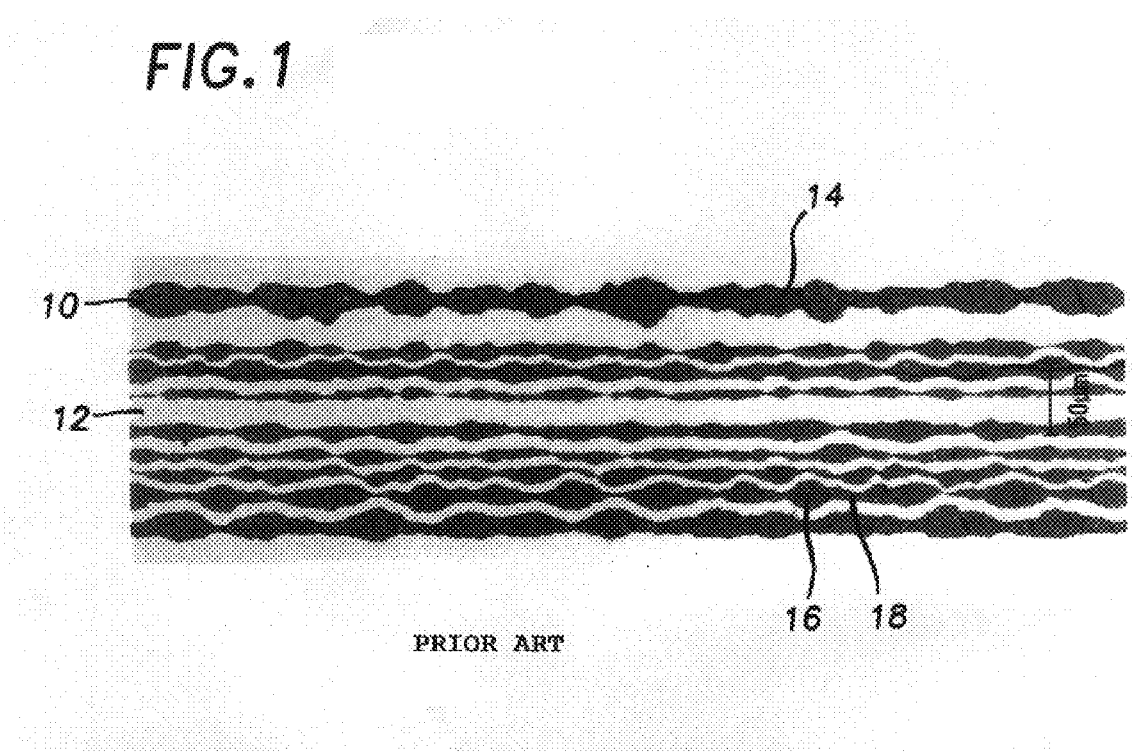
FIG. 1 is an optical photomicrograph of a cross-section of an elongated superconducting oxide composite of the prior art.

The applicants have made certain discoveries during their investigation of the effects of processing conditions and material compositions on the electrical and mechanical performance of superconducting oxides. The applicants have discovered that certain processing conditions and starting materials greatly improve the performance of the superconducting oxide article and may significantly shorten the manufacturing process used to obtain the article without compromising performance. In particular, applicants have identified a method of processing an oxide superconductor article which completely eliminates the need to perform nDS iterations, where $n \geq 2$, without compromise to the electrical current carrying properties of the article. In fact, the oxide superconducting article may exhibit superior current carrying capabilities as compared to a comparably 2DS- or 3DS-processed oxide superconductor.

In particular, the applicants have identified the following series of processing steps as providing beneficial properties to the final superconducting article: (1) phase modification of the precursor oxide article prior to rolling operations; (2) high reduction rolling of the oxide precursor article; (3) use of constrained volume multifilamentary geometries for the article; and (4) single sintering process for conversion of the precursor oxide into the oxide superconductor.

While each feature of the invention is addressed individually below, it is understood that the various aspects of the invention may be used singly or in various combinations with one another. They may additionally be used in conjunction with conventional processing steps not explicitly described in this specification. Because of the incremental improvement each feature of the invention imparts to the final superconducting article, it may be preferred to combine these features into a single process.

I. Phase Modification of the Superconducting Oxide Prior to High Reduction Rolling It has been surprisingly discovered that the final critical current of an oxide superconducting article is improved when the article is subjected to a heat treatment just prior to texture-inducing deformation. The heat treatment may result in phase modification of the oxide precursor to the superconducting oxide, however, it is not a required aspect of the invention. It is hypothesized that the heat treatment relieves internal stress introduced by the drawing or extrusion operation and that relief of the stress promotes more efficient alignment in the subsequent texture-inducing deformation operation.

In a preferred embodiment, the heat treatment is carried out at a temperature in the range of 600–800° C. and preferably in the range of 750–790° C. The heat treatment is preferably carried out at low $P_{O2}$ in the range of $10^{-5}$ atm to 1 atm, and preferably in the range of $10^{-4}$ atm to $10^{-1}$ atm. Alternatively, the oxygen partial pressure may be in the range of $10^{-5}$ to $10^{-2}$ atm.

The phase contents of the precursor oxide may be modified during the heat treatment prior to deformation. By "phase modification", as that term is used herein, it is meant to alter the phase contents of the oxide precursor of the oxide superconductor. Phase modification includes conversion of a portion of the oxide precursor from one crystallographic form to another, i.e., from an tetragonal phase to orthorhombic phase. Phase modification also includes modification of a particular phase, without conversion into a distinctly different phase, i.e., increasing or decreasing the oxygen content or dopant level of a particular phase or modifying the composition of secondary phases which are present with the precursor oxide. Modification may include changes in secondary phases, as well. It is contemplated that only a portion of the oxide superconductor may undergo phase modification. A more detailed discussion of the nature of the phase conversion and modification which occur during the phase modifying heat treatment prior to texture-inducing deformation is set forth in U.S. application entitled "Processing of (Bi,Pb)SCCO Superconductor in Wires and Tapes", filed on even day herewith as U.S. Ser. No. 08/467,033 and incorporated herein in its entirety by reference.

When the oxide superconductor used in the preparation of the multifilamentary article is a member of the BSCCO family of oxide superconductors, the lower $T_c$ oxide superconductor, $(Bi,Pb)_2Sr_2Ca_1Cu_2O_x$ (2212; where x is a value sufficient to provide a critical transition temperature of about 80 K), is used as the precursor oxide to the higher $T_c$ oxide superconductor, $(Bi,Pb)_2Sr_2Ca_2Cu_3O_y$Y (2223; where y is a value sufficient to provide a critical transition temperature of at least 100 K). The 2212 phase of the BSCCO family may exist in two different crystallographic phases, an orthorhombic phase or a tetragonal phase. The phases may be distinguished from one another by their solid state lattice parameters and X-ray diffraction (XRD) patterns and by the present or absence of particular secondary phases. For example, the tetragonal 2212 phase typically is accompanied by the presence of calcium plumbate, whereas the orthorhombic phase is noted for the absence of a calcium plumbate phase. The phase composition of the tetragonal and orthorhombic phases, as well as the nature of the tetragonal to orthorhombic conversion is discussed in greater detail in "Processing of (Bi,Pb)SCCO Superconductor in Wires and Tapes" filed on even day herewith as U.S. Ser. No. 08/467,033 and in U.S. Ser. No. 08/331,184 filed on Oct. 28, 1994 and entitled "Production and Processing of (Bi,Pb)SCCO Superconductors", both of which are incorporated herein in their entirety by reference.

In particular, it has been observed that the final critical current of 2223 oxide superconducting article is improved when the article is subjected to a heat treatment prior to texture-inducing deformation operation which promotes conversion of the tetragonal 2212 phase to the orthorhombic 2212 phase. Improvements are observed regardless of whether a predominantly tetragonal phase 2212 is converted to orthorhombic phase 2212 as a powder prior to wire formation or as an oxide filament prior to deformation.

Figure 3:
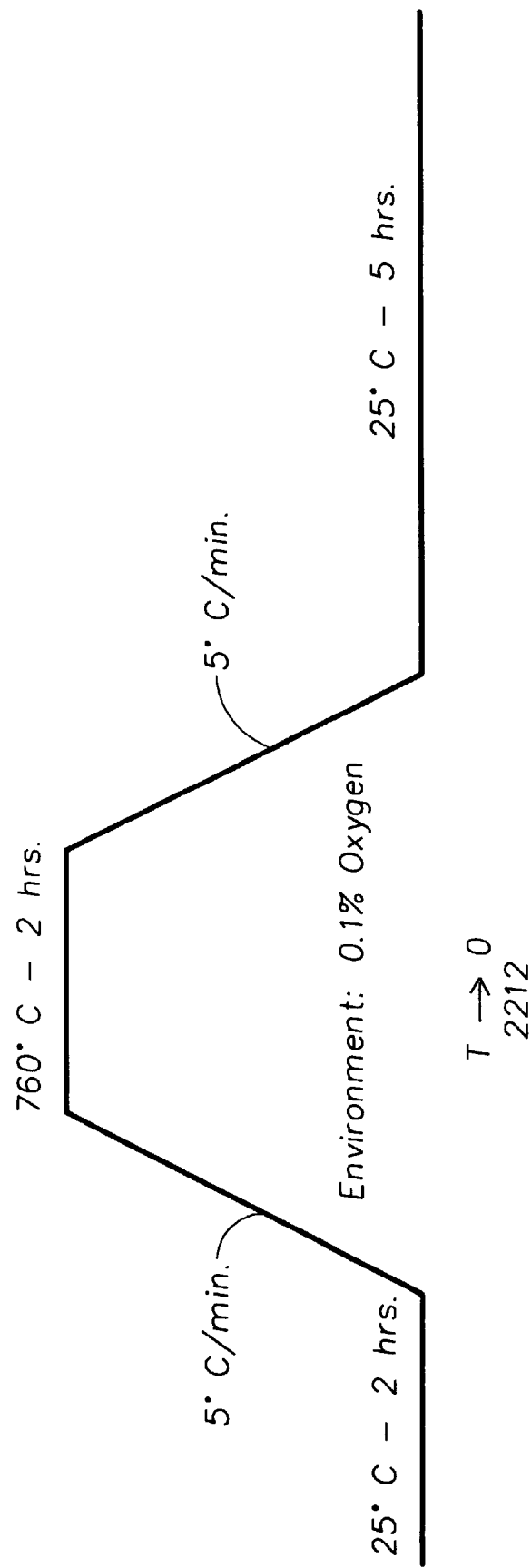
FIG. 3 is a reaction profile for the conversion of tetragonal BSCCO 2212 into orthorhombic BSCCO 2212.

The heat treatment is desirably carried out under conditions within the stability field of orthorhombic phase 2212. Tetragonal to orthorhombic phase conversion is advantageously carried out at a temperature in the range of 600–800° C., and preferably in the range of 750–790° C. and, generally, under conditions of low oxygen pressure, in particular, at a $P_{O2}$ in the range of $10^{-5}$ atm to 0.21 atm. The orthorhombic phase is favored by lower temperatures and/or oxygen partial pressures; while the tetragonal phase is favored by higher temperatures and/or oxygen partial pressures. A typical heat treatment for a T to O phase conversion is shown in FIG. 3. A more complete discussion of the is relative stabilities and conditions for phase formation of the orthorhombic and tetragonal 2212 phases is found in U.S. Ser. No. 08/331,184, which is incorporated herein by reference.

It has been observed that the tetragonal phase of 2212 is well-suited for the initial formation of multifilamentary articles by extrusion or drawing processes. Extrusion and drawing are typically used for the formation of the precursor oxide wire (which is subsequently deformed and converted into the final oxide superconductor). The orthorhombic phase of 2212, on the other hand, undergoes texturing to a much greater extent than the corresponding tetragonal phase. After an identical deformation step, a multifilamentary article including the orthorhombic 2212 phase is harder than a multifilamentary article including the tetragonal phase. The intrinsic hardness reflects the porosity of the oxide powder within the filament and intergranular coupling. Thus, it is expected that the harder orthorhombic phase would convert more readily into the 2223 phase while retaining the higher degree of texture and density. Further, wires receiving a phase modification heat treatment exhibit significantly reduced cracking during high reduction rolling. The phase modification may release the previous deformation-induced defects, e.g. dislocation, thereby obtaining a homogeneous phase conversion.

In view of the foregoing, a preferred embodiment of the invention includes an article initially prepared using a tetragonal phase 2212 oxide precursor powder. Prior to the high reduction rolling operation, the article is subjected to a heat treatment which converts the tetragonal phase into the orthorhombic phase. Thereafter, the multifilamentary article is deformed and processed into a BSCCO 2223 oxide superconductor article. The method of the invention makes use of the advantages of the orthorhombic and tetragonal phases, by using the particular phase most suited to the operation to be performed.

For example, an 85-filament oxide superconductor article was prepared from tetragonal phase BSCCO 2212, roll worked into a tape at a draft of 83% and sintered to convert the tetragonal BSCCO 2212 into BSCCO 2223 at 830° C. (40 h), followed by 811° C. (40 h) and thereafter at 787° C. (30 h) and then cooled to room temperature. The superconducting article had a $J_c$ of about 10,000 A/cm$^2$. In contrast the same 85-filament oxide superconductor article prepared from tetragonal phase BSCCO 2212, was converted into orthorhombic phase BSCCO 2212 prior to the deformation operation. The orthorhombic phase was roll worked into a tape at a draft of 83% and sintered into BSCCO 2223 at 830° C. (40 h), followed by 811° C. (40 h) and thereafter at 787° C. (30 h) and then cooled to room temperature. The superconducting article had a $J_c$ of about 40,000 A/cm$^2$, which is four times greater than the sample processed without a phase modifying heat treatment.

II. High Reduction Roll Working

In another aspect of the invention, the oxide superconductor article is subjected to a high reduction rolling operation. It has been discovered that a high reduction rolling draft carried out prior to the sintering heat treatment is highly effective in the elimination of sausaging, cracks and shear band and gives high density and high texture. High reduction rolling typically includes drafts in the range of 40% to 95% reduction in thickness. Because the rolling step typically occurs to deform the round wire or squared-off precursor form into a flattened tape, it has been labelled a "breakdown rolling" process. A multifilamentary superconducting oxide article prepared using the breakdown rolling process of the present invention exhibits highly improved texture through the whole thickness of each filament core. Core density and hardness also are improved significantly over comparable articles prepared from a multipass, low reduction rolling process.

Sausaging is a phenomenon which occurs during the rolling of a multifilamentary article (i.e.; wire or tape) in DIT processing. As shown in FIG. 1, sausaging results in a nonuniform and wavy metal/oxide superconductor interface. Although the exact source of sausaging during roll working is not definitively known, it is hypothesized that poor flow compatibility between the malleable matrix metal (also referred to elsewhere in the specification as a "constraining member") and the brittle oxide ceramic is a factor. In the prior art, low reduction rolling is normally used in DIT processing. The working force in such low reduction roll working is very small and it is not enough to penetrate through the entire thickness of the filament. Therefore, the flow of the core is believed to be non-uniform from the metal/filament interface to the filament center. Thus, densification and texture may vary considerably between the interface and the filament center. Locally high and low regions of densification in the oxide filament core also may contribute to sausaging.

The present invention overcomes the limitations of the prior art by using a high reduction draft in the rolling step. During high reduction roll working the flow properties of the matrix metal and the oxide superconductor change substantially, so that flow differences between them are minimized. The high reduction draft also completely distributes deformation energy throughout the article, so that the entire filament thickness experiences a similar flow stress. For example, a low reduction rolling pass of 5% results in a roll working force of 200 kg. In comparison, a high reduction rolling pass of 83% results in a roll working force of 1,030 kg, a five-fold increase in penetration force.

This is particularly relevant for multifilamentary articles, as compared to monofilamentary systems. Retention of flow uniformity is not particularly important in a monofilamentary article because the net mass flow of the core material relative to the surrounding constraining member or sheath will not degrade the article (think of this as analogous to a tube of toothpaste). However, in a multifilamentary system, each filament acts independently of the other filaments and will respond to the applied stress induced in the rolling operation. When the applied stress is not uniformly distributed throughout the article, as is the case in low reduction rolling, each filament will respond individually and differently to the stress. The variable response results in sausaging, cracks and other distortions common to multifilamentary articles.

The high reduction rolling is carried out at a draft in the range of 40% to 95%. In a preferred embodiment, the multifilamentary superconducting article is roll worked at a draft in the range of 60% to 85%; and in other more preferred embodiments, the article is rolled worked at a draft in the range of 75% to 85% reduction in thickness. The draft is selected so that sufficient deformation force is applied to the superconducting article to align anisotropic oxide grains, densify the oxide core and increase hardness of the article. However, at increasing drafts sufficient vertical and horizontal loads or strains are applied to the superconducting article that cracking within the oxide filaments may result. It has been observed that in multifilamentary superconducting articles, drafts greater than about 85–95% result in oxide core cracking. The particular draft threshold for cracking will depend upon the ratio of article dimension to roll diameter.

Additionally, high reduction rolling may be used in conjunction with conventional low reduction rolling, i.e., at drafts of 1–10%. It has been demonstrated that high reduction rolling of the present invention can actually correct sausaging and cracking introduced into the superconducting article from earlier low reduction roll working. Also, it has been observed that high reduction rolling can actually repair cracking introduced into the oxide filament by prior low reduction rolling operations. In order to benefit from the advantages of high reduction rolling, the high reduction rolling desirably is carried out as the last rolling step prior to the sintering heat treatment; however, it is within the scope of the invention to perform low reduction rolling after the high reduction rolling step, provided that such low reduction rolling does not reintroduce sausaging and cracking. Typically, reductions of no more than 5% are performed.

In a preferred embodiment, an elongated multifilamentary superconductor article is roll worked in low reduction draft (s) in order to deform the article into the desired geometry. Because the low reduction drafts do not densify and texture the oxide grains as efficiently as a high reduction draft, the article is "softer" and more easily deformed into the desired shape. Thereafter, the superconductor article is subjected to a high reduction draft which densifies the core and aligns the oxide grains. Typically, the article is not heated between rolling operations; however, low temperature heating (200–550° C.) may be applied to soften the metal tube. This is not to be confused with a sintering operation, which occurs at much higher temperatures (700–900° C.).

The effectiveness of a particular DIT technique will depend on the applied strain vectors and the slip systems in the superconducting oxide and the morphology of the superconducting oxide grains. The high reduction roll working of the present invention is particularly well suited to articles including oxide superconductors which have a micaceous grain structure. The precursor oxide grain structure also is preferably anisotropic and is capable of being converted (alone or in the presence of other reactants) into an oxide superconductor. Thus, superconducting oxides such as the barium-strontium-calcium-copper-oxygen (BSCCO) family, which have a micaceous structure characterized by highly anisotropic preferred cleavage planes and slip systems, are preferred oxide superconductors. Application of the high reduction roll is working operation of the present invention to the rare earth-barium-copper-oxide (YBCO) family and thallium-barium-calcium-copper oxide (TBCCO) family is within the scope of the invention, in particular, because it is known that such thermomechanical treatments improve electrical properties in these materials.

Additional materials may be used in the superconducting oxide articles including, but in no way limited to, noble metals, which do not substantially react chemically or oxidize under conditions used to process the composite, and include, but are in no way limited to, silver, gold, platinum and palladium. Such materials may be used in the filament or in the constraining member of the oxide superconducting article.

Figure 4A:
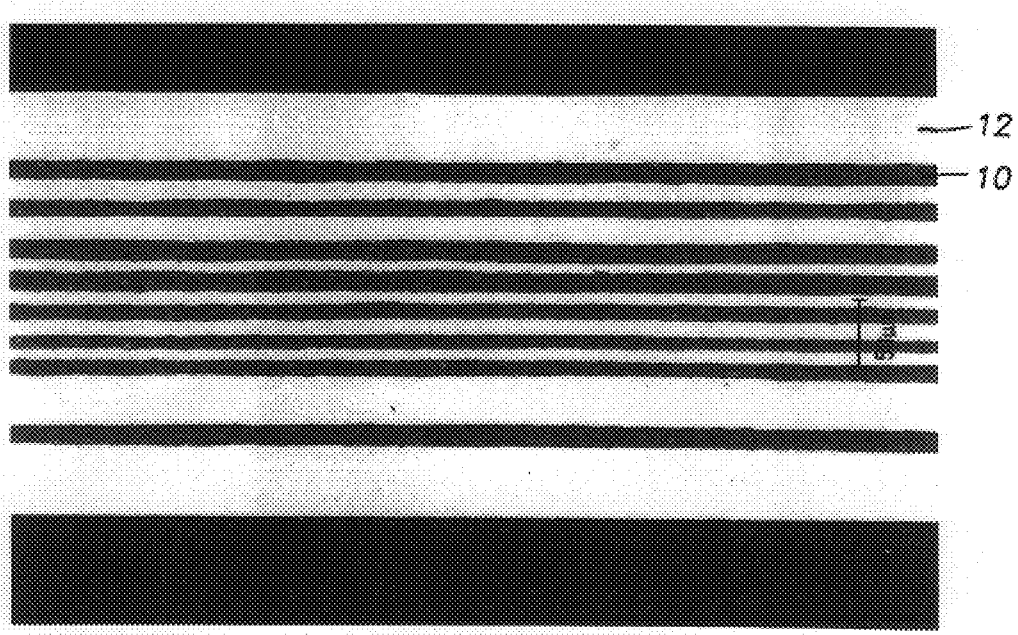
FIG. 4 is a scanning electron photomicrograph of a longitudinal cross-section of an 85 filament superconducting oxide article roll worked according to the invention (a) as rolled and (b) after sintering heat treatment.
Figure 4B:
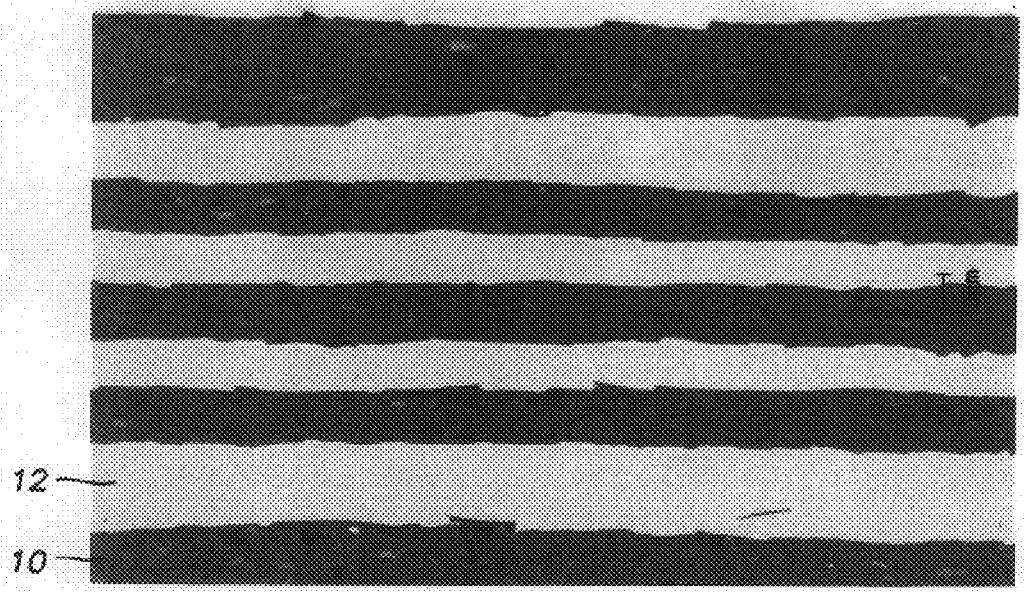
Figure 5A:
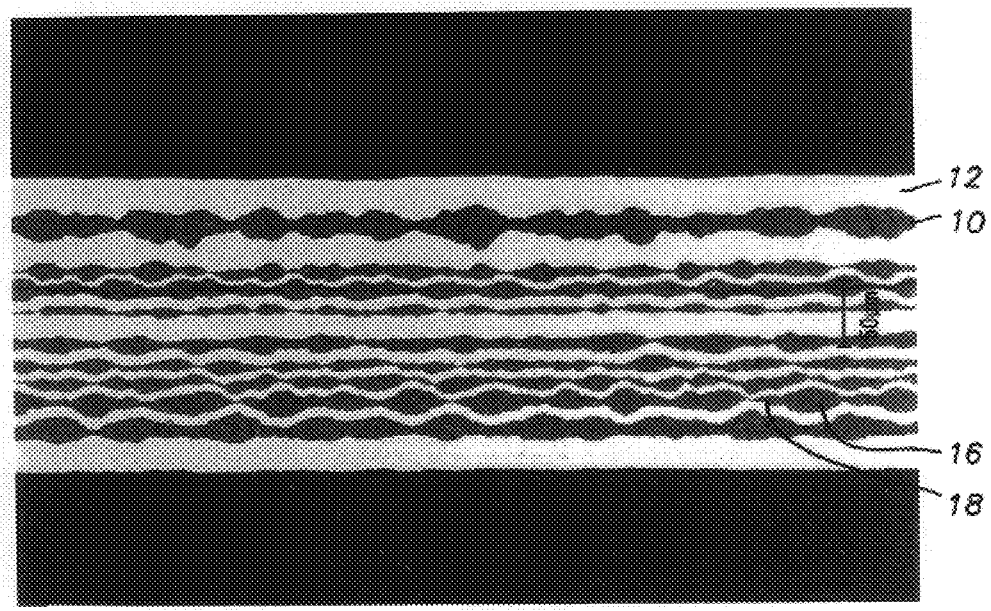
FIG. 5 is a scanning electron photomicrograph of a longitudinal cross-section of an 85 filament superconducting oxide article roll worked according to the prior art in multipass low draft reductions (a) as rolled and (b) after sintering heat treatment.
Figure 5B:
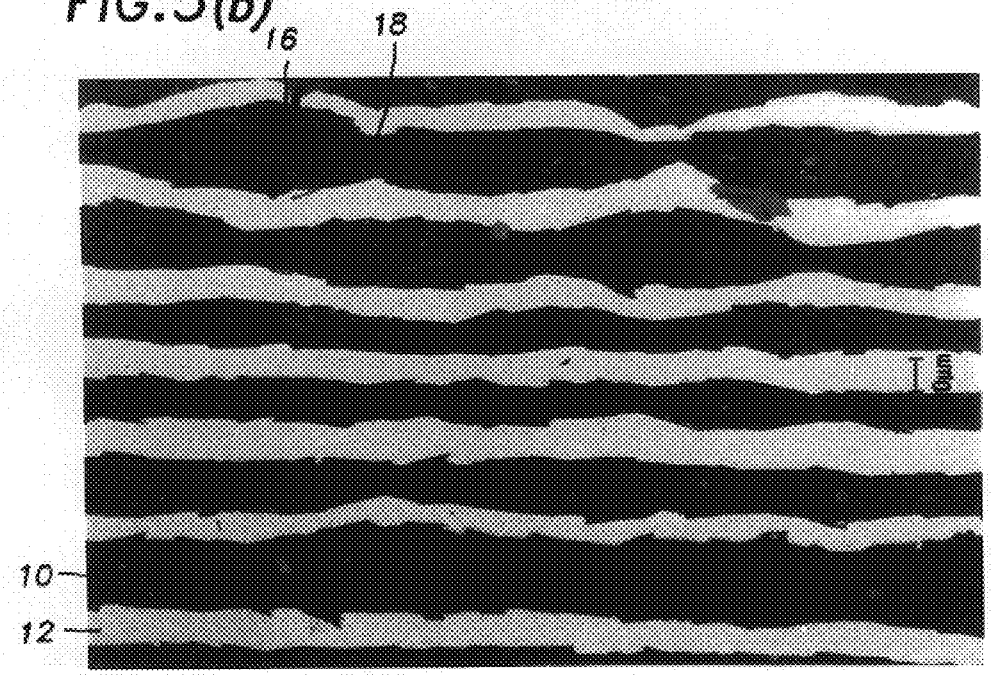

The high reduction rolling operation of the present invention results in measurable improvements to many properties of the multifilament superconducting article. Most significant is the substantial elimination of sausaging. FIG. 4 is a photomicrograph of a cross-section of a multifilamentary superconducting article that has been roll worked according to the present invention, in which like features in FIGS. 4 and 5 are similarly labelled. FIG. 4(a) is a photomicrograph of a precursor BSCCO 2212 oxide article after a single high reduction roll of 83%. FIG. 4(b) is a photomicrograph of the article in FIG. 4(a) after a sintering heat treatment to obtain the BSCCO 2223 oxide superconductor article. Similarly, FIG. 5(a) is a photomicrograph of a precursor BSCCO 2212 oxide article after a multipass reductions of 5% for each rolling, with a total reduction of 77%; and FIG. 5(b) is a photomicrograph of the article in FIG. 5(a) after a multiple sintering heat treatments to obtain the BSCCO 2223 oxide superconductor article. Comparing the micrographs of FIGS. 4 and 5, it is immediately apparent that sausaging has been substantially or completely eliminated in the former. There is no substantial distortion of the oxide filaments, either as rolled or after sintering heat treatment. There is no evidence of regions 18 of reduced thicknesses and regions 16 of expanded dimensions in the high reduction rolled sample shown in FIG. 4, In fact, the filament is of a substantially uniform dimension along the length of the article. The variation of the transverse cross-section dimension of the filaments along their length is less than 10%, and preferably less than 5%, in as rolled articles and is less than 15%, and preferably less than 10%, in sintered articles. In comparison, a sample which is processed by the multipass low reduction process of the prior art (shown in FIG. 5) is of non-uniform dimension along its length. The variation of the transverse cross-section dimension of the filaments along their length is on the order of 30–40% in both as rolled and sintered articles.

Texturing also is significantly improved in samples processed with high reduction rolling and, significantly, is highly homogeneous from the filament circumference to the filament core. For example, a multifilament superconducting article, such as that shown in FIG. 4, after a draft at 83% has a degree of texturing of 0.97 at the oxide/metal interface and 0.91 in the filament center. In comparison, the degree of texturing for a multifilament superconducting article after a multiple passes of low reduction rolling of comparable overall thickness reduction is inhomogeneous. Degree of texturing is 0.9 at the oxide/metal interface, but only about 0.6 in the center of the filament Much higher filament densities are achieved with high reduction rolling than with conventional low reduction rolling. A multifilament superconducting article after a single high reduction rolling draft has a filament density of ≧95% theoretical density. In comparison, a multifilament superconducting article after a multiple passes of low reduction rolling has a core density of about 80% theoretical density. Lastly there is a measurable difference in hardness of the resultant superconductive tapes prepared from high and low reduction rolling (200 KHN v. 100 KHN).

III. The Geometry of the Elongated Multifilamentary Superconducting Oxide Composite Optimizes the Effectiveness of the 1DS Process.

It has been determined that the microstructure of the multifilamentary precursor article can have a positive effect on the microstructure and texture of the final oxide superconductor article. Prior to conversion of the precursor oxide article into an oxide superconductor article, it may be desirable to optimize the density and degree of texture of the precursor oxide. The high density and texture then are carried through the conversion step, resulting in a final oxide superconductor that is also densely structured and highly textured. Introduction of the desired oxide microstructure into the precursor oxide, followed by processing into the oxide superconductor is particularly desirable where the final oxide is less amenable to densification and texturing.

Superconducting oxides in the YBCO, BSCCO and TBCCO families all exhibit grain growth anisotropy that results in the formation of aspected grains with thin dimensions parallel to the crystallographic c direction. If the growth of the superconducting oxide grains is constrained in one or two dimensions and unconstrained in the other dimension(s), then the longest grains will orient to grow in the unconstrained dimension(s). Thus, the fast growing a-b planes of the oxide grains align parallel to an unconstrained dimension and can grow to become very long. By the process of normal grain growth, the longer oriented grains will consume smaller grains that are not so oriented. Thus, it is possible to obtain a preferred grain alignment by constraining the anisotropic growth of the superconducting oxide grains.

Figure 6:
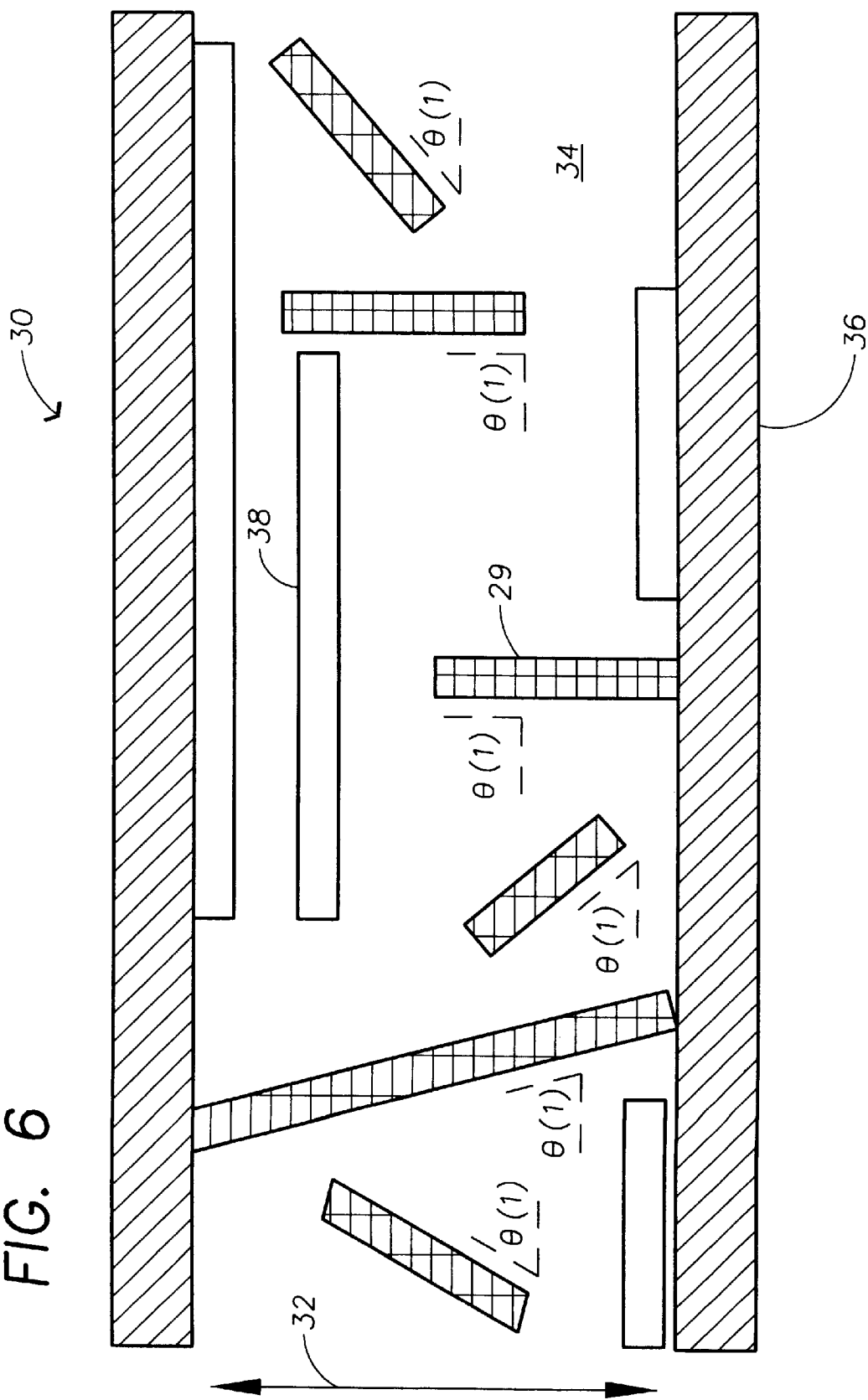
FIG. 6 is a two-dimensional schematic diagram of growing oxide superconductor grains within a constrained dimension.

It has been observed that preferred alignment of superconducting oxide grains can be obtained by the growth of oxide grains in long, thin filaments constrained within a metal matrix. Superconducting oxide compositions having improved crystallographic alignment are obtained by constraining the oxide filament diameter to a dimension on the order of the longest dimension of the oxide superconductor grain. It is therefore desirable to prepare superconducting articles having such constrained dimensions so as to take advantage of constrained grain growth. FIG. 6 illustrates a two-dimensional schematic of a constrained multifilamentary oxide superconducting article 30. The article possesses at least one thin dimension which is indicated by arrow 32 in FIG. 6. The article includes a region 34 of precursor oxide which is to be converted in the desired long oxide superconducting grains. Region 34 is constrained by a wall 36. In an embodiment where the superconducting oxide article is a multifilamentary tape, the wall 36 is a matrix material which surrounds each of the filaments. During heat treatment, superconducting oxide grains nucleate at various locations in the elongated article, yielding a variety of grain orientations, as shown in FIG. 6. For simplicity, the grains shown in FIG. 6 are assumed to be disk-like in shape with the crystallographic a-b plane of the oxide parallel to the plane of the disk. It is assumed that the grains grow faster in the planes parallel to the a-b plane than in the c direction, that is, that the plate-like grains grow rapidly in radial directions but thicken slowly. Grains 38 that are oriented substantially parallel to the constraining dimension will continue to grow unimpeded. In contrast, growth of grains 39 having an angle $\theta_1$ with the constraining dimension will be hindered. Thus, after a sufficient period for grain growth, grains 38 will subsume grains 39 so that the volume fraction of properly oriented grains increases over time.

A factor in obtaining a high degree of alignment is the ratio of the length of the grains to the thickness of the thin constraining dimension. In a preferred embodiment, the oxide superconductor article is a multifilamentary tape, having a plurality of oxide filaments constrained within a metal matrix. Each filament is not radially uniform, due to the DIT deforming operation. Each filament has a thickness and a width and it is desired that the superconducting oxide grains have at least one long dimension that is on the order of the filament-thickness. Of course, the greater the grain length, the better the constrained growth. Typical constraining dimensions (here, filament thickness) are less than 30 µm and preferably less than 5 µm.

Figure 2:
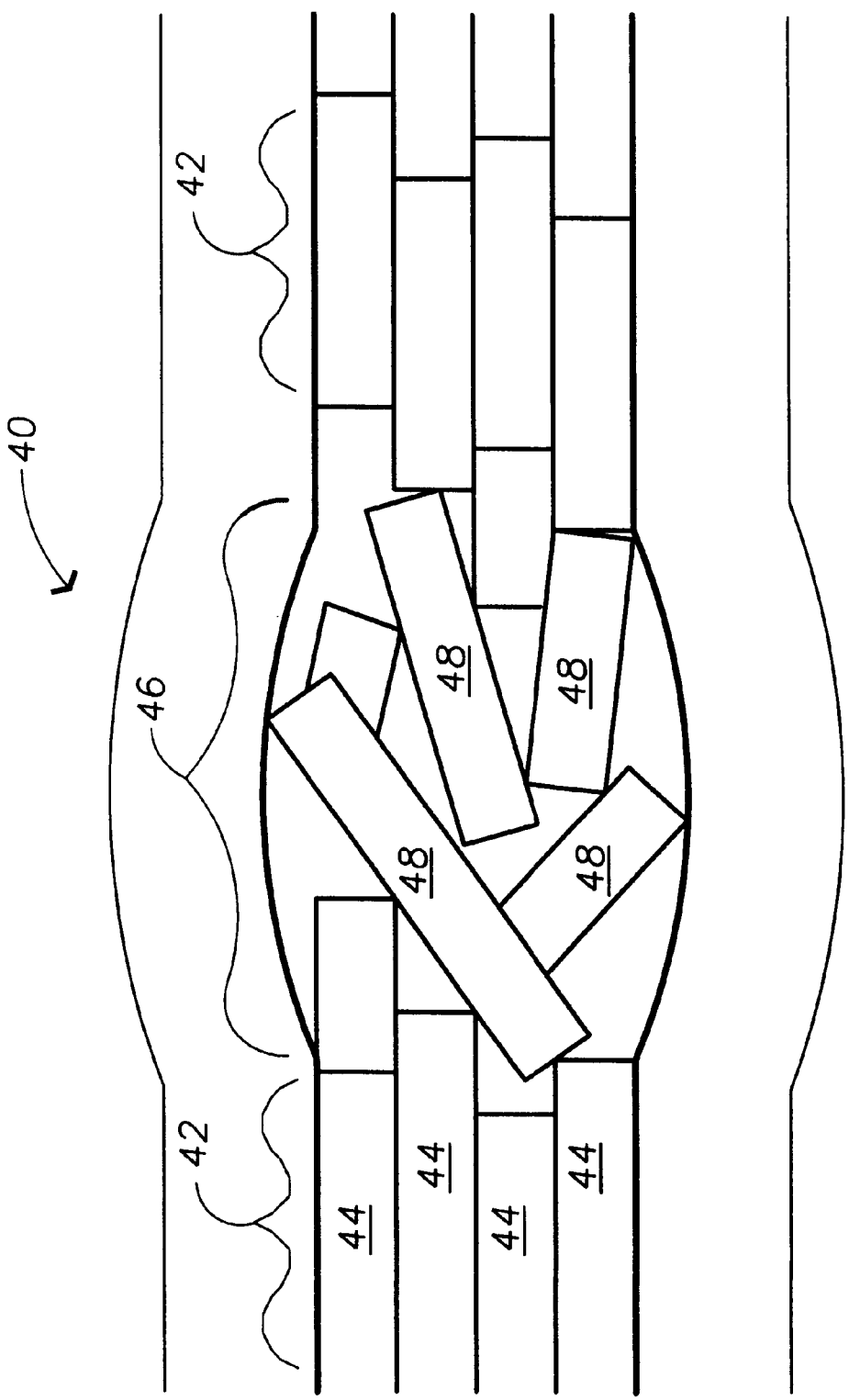
FIG. 2 is a two-dimensional schematic diagram of growing oxide superconductor grains within a constrained dimension that has been distorted by sausaging.

As discussed extensively above, however, deformation processing prior to the sintering step used to grow long grains of oxide superconductor introduces structural defects or deformations which destroy the constrained volume, at least locally (see, FIGS. 1 and 5). When rolling operations are carried out on compositions containing such long, thin filaments, "sausaging" occurs which results in filament diameters which are considerably greater than desired. In those regions, texturing and core density is reduced, as described above. FIG. 2 illustrates the effect that the narrowing and expansion of the filament thickness along the filament length has on the alignment of grains of a constrained multifilamentary oxide superconducting article 40. Article 40 includes region 42 having a dimension sufficient to constrain grain growth to substantially parallel to the constraining dimension, so as to provide dense, aligned oxide grains 44. Article 40 also contains region 46 which are of significantly greater dimension. Region 46 is typically introduced into the article 40 in rolling deformation processes. The dimension of region 46 is too large to constrain grain growth to a particular orientation. As a result, oxide grains 48 are randomly oriented. Porosity of region 46 also increases significantly, because of the reduced packing efficiency of the randomly oriented grains 48.

The present invention provides a deformation process that avoids cracking, shear band formation and sausaging, while enjoying the advantages of improved oxide grain alignment within a constrained filament diameter. In a preferred embodiment of the present invention, superconducting articles having constrained volume oxide regions are produced using the high reduction rolling pass of the present invention. As has been set forth in detail above, the high reduction rolling pass of the present invention substantially eliminates defects such as sausaging and cracking while simultaneously improving degree of alignment (texture) and oxide density.

A multifilamentary oxide precursor may be made by conventional methods. For example, an oxide powder in tube (OPIT) method may be used according to the general description given by Sandhage et al. in "Critical issues in the OPIT Processing of High-$J_c$ BSCCO Superconductors (*JOM,* 21–24 (March, 1991)), which is herein incorporated by reference, in which precursor oxides are loaded into a metallic tube and sealed. Alternatively, metals or alloys can be introduced into the metallic tube sealed and drawn, according to the general description given by Otto et al. "Properties of High $T_c$ Wires made by the Metallic Precursor Process", *JOM* 45(9), 48–52 (September 1993), incorporated herein by reference. The metal sources are added in proportions stoichiometric to the final oxide superconductor. Additional noble metals may be included in the tube in the range of 0–70 wt %. The tube is then extruded into a hexagonal cross sectional wire. The tubes are re-packed into another silver tube and then again extruded. Several of these multifilament tubes may again be repacked into yet another metal tube and deformed. The process of re-packing and extruding the multifilamentary tube is carried out until at least one dimension of each filament has obtained the desired dimension (which is a function of the final oxide grain length). Typically the desired dimension is less than 30 $\mu$m, and is preferably less than 10 $\mu$m and is more preferably less than 5 $\mu$m. Alternatively, the desired dimension is obtained by combination of processing steps, including packing and extruding filaments, as described above, and roll working the grouped, extruded filaments for a further reduction in thickness. The multifilamentary tube may be roll worked according to the present invention to obtain a multifilamentary oxide superconducting tape having constrained dimensions without defect or deformation. The multifilamentary tube is then heated to convert the powders into the oxide precursor used in subsequent processing to the oxide superconductor.

It is understood that this example is given for the purposes of illustration only and is in no way limiting of the invention. Other known means of obtaining a multifilamentary wire may be employed in the present invention, for example, any conventional source of metals may be used in the preparation of the precursor article, including by way of example metallic alloys, organometallic compounds and metal oxides.

IV. Single Step Heat Treatment (1DS Process)

Typically, density and degree of texture are developed in the article by repeated steps of deformation (to impart deformation-induced texturing) and sintering (to impart reaction-induced texturing). The process may be designated by the term "nDS", in which "D" refers to the deformation step, "S" refers to the sintering step and "n" refers both to the number of times the repetitive process of deformation and sintering are carried out. Typical prior art processes are 3DS processes.

It is useful, in appreciating the present invention, to understand the effect of a rolling deformation or a pressing deformation on an oxide superconducting article. The differing mechanical forces acting on an oxide superconductor article during a pressing or rolling operation result in different deformation and cracking behaviors. In particular, microcracks and sausaging develop along the width of a rolled oxide superconducting article (transverse to the direction of current flow), whereas microcracks and sausaging develop along the length (parallel to the direction of current flow) in a pressed sample. This 90° difference in orientation of cracks within the oxide body has a significant effect on critical current density. Because cracking and sausaging is in the direction of current flow in the pressed samples, they do not impede current flow significantly. In contrast, cracking and sausaging is perpendicular to and seriously impedes the current flow. Therefore, pressed samples exhibit a two-fold increase in $J_c$ over a comparably processed rolled sample. See, Li et al.

Pressing, however, is not practical in a continuous process. Therefore, it is desirable to develop a roll working operation which rivals or surpasses a conventional pressing operation in terms of the electrical properties obtained for conventionally pressed oxide superconductor articles. In addition to developing such a roll working operation, it is desirable to minimize the number of such process steps required to obtain at least a comparable degree of texture and oxide density. The present invention accomplishes this by selection of materials and processing steps prior to the sintering heat treatment which promote texture development and eliminate the need for repetitive steps of deformation and sintering, thereby achieving a 1DS process. The 1DS process of the present invention not only eliminates the repetitive steps of deformation and sintering, but it also provides a critical current density ($J_c$) comparable to that obtained in an nDS pressing processes and a $J_c$ which is two times greater than an nDS rolling process (where, n≧2). For the purposes of the present invention, $J_c$ is defined as the critical current per cross sectional area of the oxide superconductor filaments.

According to the method of the present invention, an oxide superconducting article having a high $J_c$ is produced by a 1DS process. In particular, an oxide superconducting article having a $J_c$ greater than 30,000 A/cm$^2$ may be obtained from the method of the present invention which utilizes only a single deformation and a single sintering step. The method relies upon appropriate selection of precursor materials and article geometry, appropriate selection of pre-"deformation/sinter" processing and appropriate selection of deformation and sintering conditions to optimize the density and texture of the article, so that the article requires only a single deformation and sintering heat treatment to obtain a superconducting article of high $J_c$. The process is described with reference to the methods previously set forth in the specification.

It is contemplated that the process may be used for preparation of oxide superconducting articles using members of the bismuth-strontium-calcium-copper oxide family of oxide superconductors (BSCCO), including doped versions thereof. An appropriate oxide precursor to the oxide superconductor is used. The precursor may be a lower order oxide superconductor, such as BSCCO 2212 in the case of BSCCO 2223, or it may be simple and/or complex non-superconducting oxides. For the purposes of simplification, the method is described with reference to the BSCCO family, in which BSCCO 2212 (and additional rare earth cuprates) oxides is a precursor oxide and the oxide superconductor is BSCCO 2223. It is recognized, however, that other oxide superconductor families may benefit from the method set forth herein.

The method is disclosed with reference to a wire or tape, however, it is recognized that the method can be readily adapted to other aspected geometries, such as sheets and films by changing the shape of the starting precursor oxide. Further, other processing operations may be contemplated and used in conjunction with the 1DS process, including by way of example an ODS (oxide dispersion strengthening) treatment or conversion of a portion of the precursor oxide into the high temperature superconducting oxide of choice. A "portion" will generally include less than 25% of oxide volume.

Figure 7:
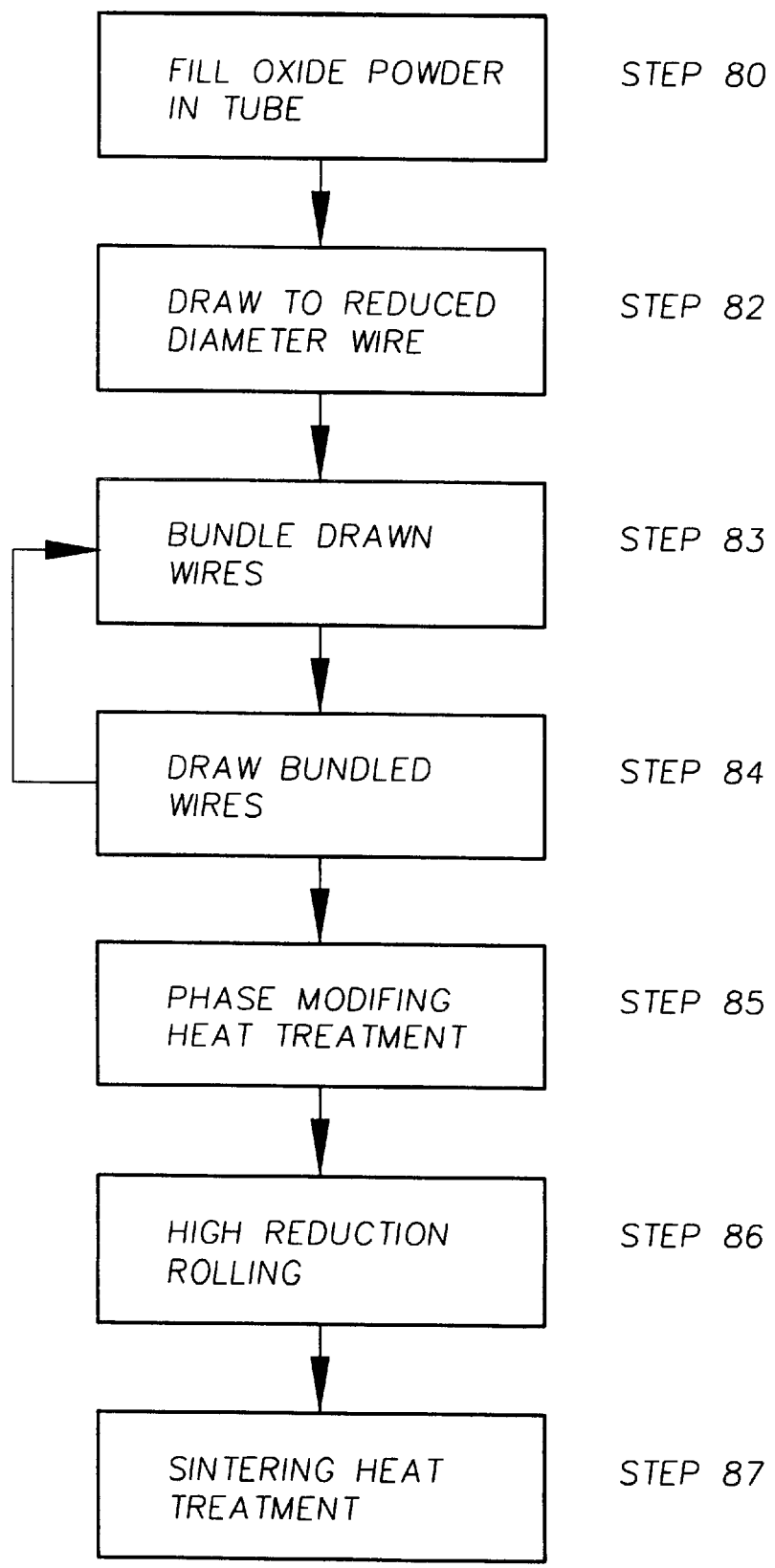
FIG. 7 is a flow diagram illustrating the processing steps in a single heat treatment of the present invention.

The 1DS method for preparing an oxide superconducting article is schematically in a preferred embodiment presented in FIG. 7. In step 80 a round wire is formed by packing a precursor oxide powder into a metal tube. The powder-filled tube then is drawn to a reduced diameter as shown in step 82.

The precursor powder may be any metal-containing powder capable of conversion into the final oxide superconductor. The quality of the powder used in the preparation of the multifilamentary article will, of course, affect the final product. Considerations in preparation of a starting oxide powder, including phase equilibria among starting oxide phases and level of dopants included in the precursor powder are addressed at length by Sandhage et al. in "Critical issues in the OPIT Processing of High-$J_c$ BSCCO Superconductors", which is herein incorporated by reference. In a preferred embodiment, the precursor powder may contain an orthorhombic BSCCO 2212 as the precursor phase. In another preferred embodiment, it may be desirable to use tetragonal phase BSCCO 2212 in preparing the round wire because it has been observed previously that tetragonal BSCCO 2212 performs well in extrusion operations. See, Section I above.

The metal tube is typically silver, but may be any malleable material, including alloys, which do not react readily with the constituent elements of the oxide superconductor or oxygen under processing conditions. The metal tubes acts to house and constrain the precursor filaments.

A plurality of drawn wires are then bundled together (step 83) and extruded together (step 84) to provide a multifilamentary wire. Steps 83 and 84 may be repeated until a multifilamentary wire of sufficient filament density and filament diameter is obtained. Filament diameters are selected which will provide the desired constrained volume to promote aligned oxide grain growth as described in Section III.

The multifilamentary wire is then subjected to a phase modifying heat treatment, as shown in step 85. The phase modification has the effect of reducing internal stresses and optimizing the phase composition to promote texturing in subsequent texturing operations. In the case of BSCCO 2212, a heat treatment may be selected which converts a predominantly tetragonal phase BSCCO into a predominantly orthorhombic phase BSCCO 2212. Conditions are set forth in the Section I.

The phase modified round wire is then subjected to a high reduction rolling operation at a draft of 40% to 95%, which densifies the oxide powder and significantly enhances the degree of alignment of the oxide grains, as shown in step 86. In many instances, a single high reduction rolling operation will be sufficient. It has been observed that a single high reduction rolling can produce degree of texturing of about 0.9 throughout the article. It may be desirable, however, to perform additional rolling operations before or after high reduction rolling. In contrast to prior art processes, however, no sintering heating occurs between rolling operations. Prior to high reduction rolling, either high or low reduction rolling may occur, typically in order to suitably shape the article prior to high reduction rolling. After high reduction rolling, low reduction rolling may occur, provided that it does not reintroduce sausaging and cracking. Details and modifications of the high reduction rolling step are set forth in Section II, which may be applied to the 1DS process.

The rolled article is subjected to a single sintering heat treatment, during which reaction induced texture further enhances degree of texture and the precursor oxide is converted into the oxide superconductor, as shown in step 87. The heat treatment is selected so as to promote reaction-induced texture during conversion of the precursor oxide into the oxide superconductor.

A three-stage heat treatment has been developed as being well-suited for use in the 1DS heat treatment for the BSCCO 2223 system. The first stage of the heat treatment is selected to form a liquid phase which co-exists with solid phases. The liquid phase bonds the precursor orthorhombic BSCCO 2212 crystals together and may convert a portion of the precursor into the BSCCO 2223 oxide superconductor. The second stage of the heat treatment is selected to complete conversion of the precursor into the oxide superconductor phase. Lastly, the third stage of the heat treatment is selected to heal and promote grain interconnectivity of the BSCCO 2223 oxide phase and optimize electronic performance. A typical heat treatment profile is provided in FIG. 8. (3generally, a preferred temperature range for the first step is in the range of about 810–850° C; a preferred temperature range for the second step is in the range of about 800–840° C.; and a preferred temperature range for the third step is in the range of about 700–800 C. It is desirable that the heat treatment does not reform is the tetragonal 2212 phase in the sintering heat treatment, as that phase has been observed to convert only poorly into the BSCCO 2223 oxide superconductor. Further detail in determining the optimal heating ranges for the various stages of the single sintering step is described in U.S. Ser. No. 08/041,822 filed Apr. 1, 1993 entitled "Improved Processing of Oxide Superconductors", now issued as U.S. Pat. No. 5,635,456 which is incorporated herein in its entirety by reference. Further detail in obtaining an oxide superconductor without formation of the BSCCO 2212 tetragonal phase is described in U.S. Ser. No. 08/331, 184, which is incorporated herein by reference.

IV. The Multifilamentary Article of the Invention.

The multifilamentary article of the present invention is characterized by highly uniform filament dimensions along the longitudinal cross-section of the article. Variation in filament uniformity is less than about 5%, and alternatively less than about 10%, in a multifilamentary oxide superconductor article as-rolled. Variation in filament uniformity is less than about 10%, and alternatively less than about 15%, in a multifilamentary oxide superconductor article after sintering heat treatment. This represents a marked improvement over conventionally processed, low reduction multipass articles, which typically have variation of greater than 30% and even greater than 40% along their filament lengths. The multifilamentary article may include a variety of filament counts, such as by way of example, 19, 85 and up to 10,000 filaments per article. In particular, filament counts of 10–1000 filaments per article are desirable.

The multifilamentary article of the present invention is further characterized by increased hardness in the high reduction, as-rolled multifilamentary article, as compared to a low reduction, multipass multifilamentary article. For example, the oxide filaments in the multifilamentary article of the present invention typically have a hardness in the range of about 200 KHN.

Further, the multifilamentary article of the present invention provides superior current carrying capacities in applied fields. The ability to carry current in a field depends upon the c-axis orientation relative to the field. It has been observed that texture is localized along the silver/oxide interface. In prior art articles, where that interface is distorted and wavy, the c-axis orientation along the interface varies from point to point. Current-carrying capacity is thereby correspondingly decreased in the applied field.

The multifilamentary oxide article of the present invention is further distinguishable over a monofilamentary oxide article. The multifilamentary article is markedly lacking in cracking and stress fissures within the oxide filaments of the article. This is clearly observed with reference to FIGS. 9(a) and 9(b), which are photomicrographs of a cross-sectional top view of (a) a multifilamentary oxide article of the invention 90 and (b) a monofilamentary article of the prior art 100. The overall article dimensions are comparable; however, the multifilamentary article is composed of 85 filaments 92 of much narrower dimension than monofilament 102. Both multifilament and monofilament articles were deformed in a single high reduction rolling operation of 80%. The silver sheath was removed by dissolution in a $NH_4OH/H_2O_2$ solution.

Figure 9A:
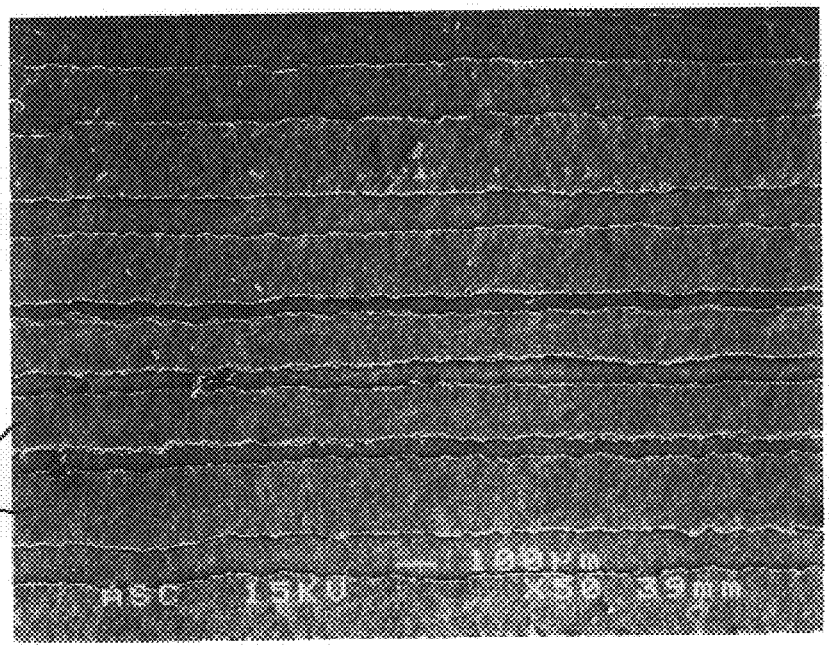
FIG. 9 is a photomicrograph of a longitudinal cross-section of (a) a multifilamentary superconducting oxide article and (b) a monofilamentary superconducting article, both roll worked at a draft of about 83%.
Figure 9B:
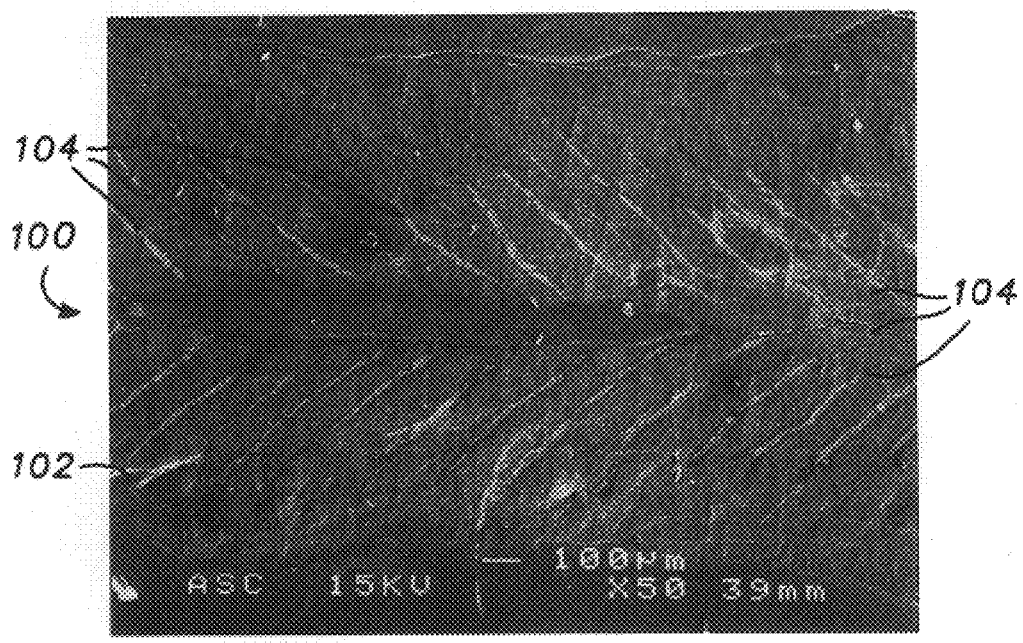

The micrograph of the monofilament tape in FIG. 9(b) shows that an 80% reduction results in significant non-uniformity across the monofilament 102 width. Specifically, the large reduction rolling process causes a cracking 104 of the core originating from the center line of the core parallel to the deformation direction. A very distinctive chevron cracking pattern is visible in the micrograph, having very obvious deleterious effect on current carrying capacities.

The micrograph of the multifilament tape in FIG. 9(a) shows that an 80% reduction results in no cracking or strain dislocation of the oxide filaments 92. While not being bound to a particular theory of operation, it is suggested that the more uniform deformation is due to the presence of the silver interspersed throughout the ceramic core. The silver acts as a continuous hydrostatic stress component to uniformly distribute the stress throughout the article. Each filament is permitted to move and react individually to the stresses applied to the core during deformation.

The method of the invention will be understood with reference to the following examples, which are presented by way of example only and which are in no means to be considered limiting of the invention.

EXAMPLE 1

This Example illustrates the 1DS Process for a 19-filament oxide superconductor article.

A mixture of Bi, Pb, Sr, Ca, and Cu nitrates with metal ratios of 1.74:0.34:1.91:2.03:3.07 was calcined at 800° C. for 18 hrs, and then ground to reduce the particle size of the oxide powder. The oxide powder was also heat treated at 780° C. for 6 hrs in pure $O_2$. At this stage, the powder contains tetragonal 2212, $Ca_2PbO_4$, and CuO phases.

The powder was packed into a pure silver billet of 0.625" (1.6 cm) OD×0.315" (0.8 cm) ID. The loaded billet was extruded and then drawn into a hexagonal monofilament wire of 0.140" (0.35 cm). This hexagonal monofilament wire was cut into 19 equal length pieces and bundled into a 0.84" (2.1 cm)×0.76" (1.9 cm) pure silver tube. The bundled 19 filament tube was drawn down to a round wire of 0.0354" (0.9 mm).

The 0.0354" (0.9 mm) round wire was cut into two half. In order to convert the tetragonal 2212 into orthorhombic 2212 phase in the wire, one half of the wire was annealed at 760° C. for two hours in an $N_2$ atmosphere containing 0.001 atmosphere $O_2$. The other half wire with tetragonal 2212 was annealed at 300° C. for 0.5 hr in pure oxygen for releasing the strain on silver only. Both the tetragonal and orthorhombic 2212 wires were cut into individual sample lengths. The samples were rolled into 0.006" (0.15 mm) thick tapes by either a multipass, low reduction rolling operation or a single pass, high reduction rolling operation. The low reduction operation included a 5% reduction per draft using a one inch (2.54 cm) roll for a total reduction in thickness of 83%. The high reduction rolling operation included 83% reduction in single draft using a four inch (10 cm) roll. The tetragonal 2212 phase sample subjected to multipass rolling was designated as Tape 1 and orthorhombic 2212 phase sample subjected to multipass rolling was designated as Tape 2. The tetragonal 2212 phase sample subjected to single pass rolling was designated as Tape 3 and orthorhombic 2212 phase sample subjected to single pass rolling was designated as Tape 4. These four tapes were directly sintered using a single heat treatment profile in FIG. 8. The $J_c$ results for these four tapes are summarized in Table 1. The data are an average of four samples with 5% variation.

TABLE 1

1DS $J_c$ results (77 K, self field) from the 19 filamentary tapes with different starting oxide phases and deformation conditions.

| Sample | Starting phase content | Deformation Step | Average 1DS Jc, $A/cm^2$ |
|---|---|---|---|
| Tape 1 | Tetragonal 2212 | 5% per draft multipass rolling (total 83%) | 5,600 |
| Tape 2 | Orthorhombic 2212 | 5% per draft multipass rolling (total 83%) | 16,000 |
| Tape 3 | Tetragonal 2212 | 83% in single draft rolling | 15,000 |
| Tape 4 | Orthorhombic 2212 | 83% in single draft rolling | 31,000 |
| Comparison Tape 5 | Tetragonal 2212 | 3DS rolled | 14,000 |
| Comparison Tape 6 | Orthorhombic 2212 | 3DS rolled | 20,000 |
| Comparison Tape 7 | Orthorhombic 2212 | 3DS pressed | 36,000 |

Comparison Example 1

Wires prepared according to Example 1 were processed in a conventional 3DS process and the electrical properties were compared.

Figure 8:
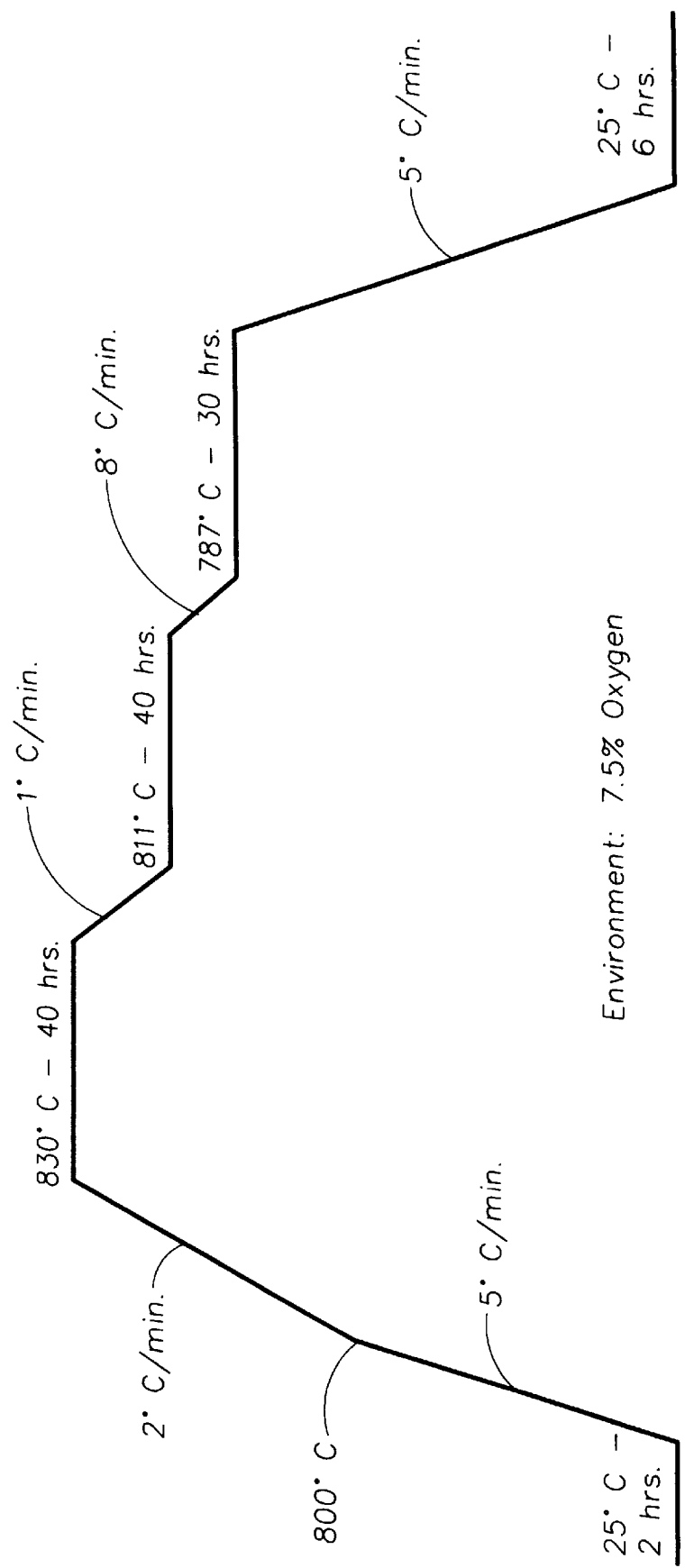
FIG. 8 is a reaction profile of a three-step heat treatment for use in the single step heat treatment of the present invention.

Tapes prepared according to example 1 were subjected to a 3DS process with intermediate rolling (4" roll) or pressing deformation, with the Comparison Tape having the identical preparation (oxide phase) as in Example 1, with the exception of the use of a multiple deformation and sintering operation. Both pressing and rolling deformations were performed and the results of the two types of deformation compared. The 3DS process for these tapes included the following steps:

1. sintering the tapes at 822° C. for 12 hrs in an $N_2$ atmosphere containing 0.075 atmosphere $O_2$;
2. rolling or pressing the tapes with 10% reduction;

-continued 3. repeating the above sintering step;
4. rolling or pressing the tapes again with 10% reduction; and
5. sintering in a final heat treatment using the profile in FIG. 8.

A 3DS pressed Comparison Tape 6 has a $J_c$ of 36,000 A/cm$^2$, while a 3DS rolled Comparison Tape 7 has a $J_c$ of only 20,000 A/cm$^2$. It is clear, therefore, that 3DS pressed samples afford a superconducting article having superior critical current densities, as compared to 3DS rolled samples. This is consistent with earlier observations. In comparison, Tape 4 from Example 1 (1DS high reduction rolled sample) exhibits a critical current density (31,000 A/cm$^2$) which is on the order of the pressed 3DS comparison tape (36,000 A/cm$^2$) and much higher than the comparable 3DS rolled sample (20,000 A/cm$^2$). In conclusion, the 1DS process of the present invention provides oxide superconducting articles superior to conventionally prepared rolled samples and on the order of conventionally prepared pressed samples. Further improvements in performance may be expected upon optimization of the invention.

Further, 3DS rolled Comparison Tape 5 (tetragonal phase) has $J_c$ of only 14,000 A/cm$^2$, as compared to 15,000 A/cm$^2$ in Tape 3. These results indicate that the $J_c$ improvement is not only benefitted by the high reduction rolling, but also from the phase modification of tetragonal BSCCO 2212 to orthorhombic BSCCO 2212.

EXAMPLE 2

This example illustrates the 1DS process for an 85-filament oxide superconductor article. The powder preparation was as same as described in Example 1.

The powder was packed into a pure silver billet of 1.25" OD×0.840" ID. The loaded billet was extruded and then drawn into a hexagonal monofilament wire of 0.055". This hexagonal monofilament wire was cut into 85 equal length pieces and bundled into a 0.76"×0.6" pure silver tube. The bundled 85 filament tube was drawn down to a round wire of 0.0354" (0.9 mm).

The 0.0354" (0.9 mm) round wire was cut into two half. In order to convert the tetragonal 2212 into orthorhombic 2212 phase in the wire, one half of the wire was annealed at 760° C. for two hours in an $N_2$ atmosphere containing 0.001 atmosphere $O_2$. The other half wire with tetragonal 2212 was annealed at 300° C. for 0.5 hr for releasing the strain on silver only. Both the tetragonal and orthorhombic 2212 wires were cut into individual sample lengths. The samples were rolled into 0.006" (0.15 mm) thick tapes by either a multipass, low reduction rolling operation or a single pass, high reduction rolling operation. The low reduction operation included a 5% reduction per draft using a one inch (2.54 cm) roll for a total reduction in thickness of 83%. The high reduction rolling operation included 83% reduction in single draft using a four inch (10 cm) roll. The tetragonal 2212 phase sample subjected to multipass rolling was designated as Tape 8 and orthorhombic 2212 phase sample subjected to multipass rolling was designated as Tape 9. The tetragonal 2212 phase sample subjected to single pass rolling was designated as Tape 10 and orthorhombic 2212 phase sample subjected to single pass rolling was designated as Tape 11. These four tapes were directly sintered using a single heat treatment profile in FIG. 8. The $J_c$ results for these four tapes are summarized in Table 2. The data are an average of four samples with 5% variation.

TABLE 2

1DS Jc results (77 K, self field) from the 85 filamentary tapes with different starting oxide phases and deformation conditions.

| Sample | Starting phase content | Deformation conditions | Average 1DS $J_c$, A/cm$^2$ |
|---|---|---|---|
| Tape 8 | Tetragonal 2212 | 5% per draft multipass rolling (total 83%) | 9,000 |
| Tape 9 | Orthorhombic 2212 | 5% per draft multipass rolling (total 83%) | 25,000 |
| Tape 10 | Tetragonal 2212 | 83% in single draft rolling | 10,000 |
| Tape 11 | Orthorhombic 2212 | 83% in single draft rolling | 40,000 |
| Comparison Tape 12 | Orthorhombic 2212 | 2DS pressed | 46,000 |
| Comparison Tape 13 | Orthorhombic 2212 | 2DS rolled | 36,000 |
| Comparison Tape 14 | Tetragonal 2212 | 2DS rolled | 23,000 |

Comparison Example 2

Wires prepared according to Example 2 were processed in a conventional 2DS and 3DS process and the electrical properties were compared.

Tapes prepared according to example 2 were subjected to either a 2DS or a 3DS process with intermediate rolling (4" roll) or pressing deformation, with the Comparison Tape having the identical preparation (oxide phase) as in Example 2, with the exception of the use of a intermediate deformation and sintering operation. Both pressing and rolling deformations were performed and the results of the two types of deformation compared. The 3DS process is that described in Comparison Example 1. The 2DS process for these tapes included the following steps:

1. sintering the tapes at 822° C. for 12 hrs in an $N_2$ atmosphere containing 0.075 atmosphere $O_2$;
2. rolling or pressing the tapes with 20% reduction; and
3. sintering in a final heat treatment using the profile in FIG. 7.

For Comparison Tape 12, the 2DS pressing yields $J_c$ of 46,000 A/cm$^2$, while $J_c$ is only 36,000 A/cm$^2$ by 2DS rolling of Comparison Taped 13. The 2DS rolled Comparison Tape 14 has $J_c$ (tetragonal 2212 phase) of only 23,000 A/cm$^2$. These results further support that the $J_c$ improvement is not only benefitted from the high reduction rolling, but also from the phase modification of tetragonal 2212 to orthorhombic 2212. In general, both 3DS pressing and 3DS rolling processes have $J_c$ results of about 10% lower than the above 2DS pressing and rolling, respectively.

In conclusion, the 1DS process has superior $J_c$ performance compared to both 2DS and 3DS rolling process, and it is comparable to the 2DS pressing process. It is also interesting to note that the $J_c$ values of the 85 filamentary tapes are about 30% higher than the 19 filamentary tapes. This may be due to the reduced filament size in the high filamentary tapes which should benefit from the higher degree of growth constrained in volume.

EXAMPLE 3

This example demonstrates the use of low reduction rolling passes with a final high reduction rolling pass in a 1DS process.

A bundled tube as prepared in Example 2 was drawn to round wire of 0.0508" (1.3 cm) in diameter. The round wire was rolled into a rectangular shape of 0.0354" (0.9 mm) thick and 0.045" (1.1 mm) wide using a 5% reduction per draft in multipass. After this low reduction multipass rolled stage, the accumulated reduction in thickness was 30.3%, and the rectangular wire still contained tetragonal 2212 phase. Tetragonal 2212 phase is preferred in this early stage rolling operation because it is more amenable to "shaping" than the orthorhombic phase.

The rectangular wire is then heated to modify the tetragonal 2212 phase contents to orthorhombic 2212 phase by annealing at 760° C. for two hours in an $N_2$ atmosphere containing 0.001 atmosphere $O_2$. Thereafter, the wire was rolled into 0.006" (0.15 mm) in a single draft of 57.9% reduction. The total reduction of the 0.0508" (1.3 mm) wire rolled to 0.006" (0.15 mm) is 88.2%.

The 0.006" (0.15 mm) tapes were sintered using the single heat treatment profile in FIG. 8. These samples have $J_c$ value on average of 39,000 A/cm². It supports the proposition that the high reduction pass can also be employed at the final pass of the deformation, in which low reduction rolling operations have been previously performed.

EXAMPLE 4

This example demonstrates the uniform filament dimensions along the longitudinal cross-section of an article subjected to high reduction rolling.

An 85-filament wire was prepared as in Example 2 and subjected to a low reduction multipass rolling of the prior art and a high reduction single pass reduction of the present invention.

Single pass high reduction rolling using 4" rollers was performed at a total reduction of 83%. The round wire was deformed from an OD of 35.4 mil (0.9 mm) down to 6 mil (0.15 mm) in a single step. A heat treatment according to FIG. 8 was performed. The longitudinal cross-sectional view of this sample is shown in FIGS. 4(a) and 4(b).

A multipass low reduction using 1" rollers was performed at 5% reductions for a total reduction of 77%. The round wire was deformed from an OD of 72 mil (1.8 mm) down to 17 mil (0.43 mm). A further heat treatment according to the 3DS process described in Comparison Example 1 was performed. The sample was further reduced in thickness to a final reduction in thickness of 84%. The longitudinal cross-sectional view of this sample is shown in FIGS. 5(a) and 5(b).

Each of the filaments were measured along its length to determine the variation in filament thickness. The results of these measurements are reported in Table 3.

TABLE 3

Filament uniformity in 85-filament tapes prepared by low and high reduction rolling operations.

|  |  | filament 1 | filament 2 | filament 3 | filament 4 | filament t 5 |
|---|---|---|---|---|---|---|
| Tape 15 | as-rolled; thickness; µm (% dev) | 17.0 (3.79) | 11.91 (3.17) | 12.47 (3.31) | 15.99 (2.73) | 12.58 (6.12) |
|  | 1DS heat treatment; µm (% dev) | 19.56 (10.36) | 17.72 (7.27) | 17.46 (7.31) | 16.24 (5.96) | 31.53 (7.06) |

TABLE 3-continued

Filament uniformity in 85-filament tapes prepared by low and high reduction rolling operations.

|  |  | filament 1 | filament 2 | filament 3 | filament 4 | filament t 5 |
|---|---|---|---|---|---|---|
| Comparison Tape 16 | as-rolled; thickness; µm (% dev) | 13.43 (32.67) | 8.05 (47.37) | 10.32 (23.09) | 8.61 (41.53) | 18.08 (39.27) |
|  | 3DS heat treatment µm (% dev) | 21.52 (32.85) | 18.37 (30.84) | N/A | N/A | N/A |

A comparison of the filament thicknesses and the percent variation along the length reveals that the samples subjected to high reduction rolling at 83% are more uniform in dimension than a sample which has been subjected to low reduction rolling at a comparable reduction in thickness. For example, Tape 15 as rolled shows a variation of about 3.5% along its filament lengths (actual range of 2.73 to 6.12); whereas Comparison Tape 16 as rolled shows a variation of about 35% along its filament lengths (actual range of 23.09 to 47.37). Similar results are shown for the sample after conversion by heat treatment to the oxide superconductor. Note that the variability in filament dimension increases somewhat for the heat treated sample.

It should be readily apparent to those skilled in the art that the methods and advantages of the present invention are capable of being used in all superconducting articles having a variety of configurations and morphologies. It is not intended to be limited to multifilamentary superconducting articles. The description and examples are set forth in the specification for the purposes of illustration only and are by no means intended to be limiting of the invention. The scope and nature of the invention are set forth in the claims which follow.

What is claimed is:

1. A multifilamentary oxide article comprising:
    a plurality of filaments comprising a bismuth-strontium-calcium-copper oxide (BSCCO) superconductor, said filaments extending continuously for the length of the article; and
    a constraining member substantially surrounding each said filament,
    wherein each of said filaments has an average transverse cross-sectional thickness less than about 35 µm and an average variation in cross-section along its length of less than about 10%, and wherein the oxide filament of the article is textured and the degree of texturing is greater than 0.9 throughout the oxide filament.

2. The article of claim 1, wherein the oxide superconductor comprises BSCCO 2223.

3. The article of claim 1, wherein the oxide superconductor comprises orthorhombic BSCCO 2212.

4. The article of claim 1, wherein each of said filaments has an average transverse cross-sectional thickness of less than about 20 µm and an average variation in cross-section along its length of less than about 7%.

5. The article of claim 1, wherein each of said filaments has an average transverse cross-sectional thickness of less than about 10 µm.

6. The article of claim 1, wherein at least one of said filaments has a hardness of greater than or equal to 200 KHN.

7. The article of claim 1, wherein at least one of said filaments of the article has an oxide density of greater than or equal to 95% theoretical density.

8. The article of claim 1, wherein at least one of said filaments comprise BSCCO oxide grains of at least about 5 microns in at least one dimension.

9. The article of claim 1, wherein said plurality of filaments are aspected.

10. The article of claim 9, wherein said aspected filaments and constraining member together form an aspected composite article.

11. The article of claim 1, wherein the article has a critical current density Jc (77K, self-field) of greater than or equal to 39,000 A/cm$^2$.

* * * * *